United States Patent
Shigihara et al.

(10) Patent No.: US 8,402,353 B2
(45) Date of Patent: Mar. 19, 2013

(54) CYCLIC CODE PROCESSING CIRCUIT, NETWORK INTERFACE CARD, AND CYCLIC CODE PROCESSING METHOD

(75) Inventors: Masahiro Shigihara, Minato-ku (JP); Toru Takamichi, Minato-ku (JP)

(73) Assignee: NEC Corporation, Tokyo (JP)

( * ) Notice: Subject to any disclaimer, the term of this patent is extended or adjusted under 35 U.S.C. 154(b) by 641 days.

(21) Appl. No.: 12/557,269

(22) Filed: Sep. 10, 2009

(65) Prior Publication Data
US 2010/0070839 A1 Mar. 18, 2010

(30) Foreign Application Priority Data
Sep. 12, 2008 (JP) ................................ 2008-235124

(51) Int. Cl.
G06F 11/10 (2006.01)
H03M 13/00 (2006.01)
(52) U.S. Cl. .................... 714/806; 714/757; 714/807
(58) Field of Classification Search .................... None
See application file for complete search history.

(56) References Cited

U.S. PATENT DOCUMENTS

| | | | | |
|---|---|---|---|---|
| 5,282,214 A * | 1/1994 | Dravida | ....................... | 714/757 |
| 5,870,413 A * | 2/1999 | Kodama et al. | ............... | 714/758 |
| 6,910,172 B2 * | 6/2005 | Hara et al. | ..................... | 714/757 |
| 7,168,024 B2 * | 1/2007 | Farnsworth | .................... | 714/758 |
| 7,266,760 B1 * | 9/2007 | Bain | ............................. | 714/807 |
| 7,363,574 B1 * | 4/2008 | Maitland et al. | .............. | 714/759 |
| 7,590,916 B2 * | 9/2009 | Katashita et al. | ............. | 714/757 |
| 7,941,727 B2 * | 5/2011 | Greenlaw | ...................... | 714/758 |
| 2001/0037481 A1 * | 11/2001 | Suzuki et al. | ................. | 714/758 |

FOREIGN PATENT DOCUMENTS

| | | |
|---|---|---|
| JP | 58-072253 A | 4/1983 |
| JP | 58072253 | 4/1983 |
| JP | 6-252777 A | 9/1994 |
| JP | 6252777 | 9/1994 |
| JP | 9-069836 A | 3/1997 |
| JP | 9069836 | 3/1997 |
| JP | 2001-285076 A | 10/2001 |
| JP | 2001285076 | 10/2001 |
| JP | 2002-359561 | 12/2002 |
| JP | 2002-359561 A | 12/2002 |
| JP | 2005-6188 A | 1/2005 |
| JP | 2009-55407 A | 3/2009 |

OTHER PUBLICATIONS

JP Patent Application Publication No. 2005-006188.*
Communication dated Nov. 15, 2011 from the Japanese Patent Office in counterpart Japanese.

* cited by examiner

*Primary Examiner* — Steve Nguyen
(74) *Attorney, Agent, or Firm* — Sughrue Mion, PLLC

(57) ABSTRACT

A cyclic code processing circuit, network interface card, and method for calculating a remainder from input data comprising a plurality of bits arranged in parallel. The calculation is performed by first computing a first remainder obtained by dividing an integral multiple data block by a generator polynomial, the integral multiple data block comprising a plurality of words that precede the final word of the input data. Then, a second remainder is computed by dividing the final word by the generator polynomial, the final word comprising the parallel bits located at the end of the input data. The input data remainder is calculated using the first and the second previously calculated remainders.

10 Claims, 16 Drawing Sheets

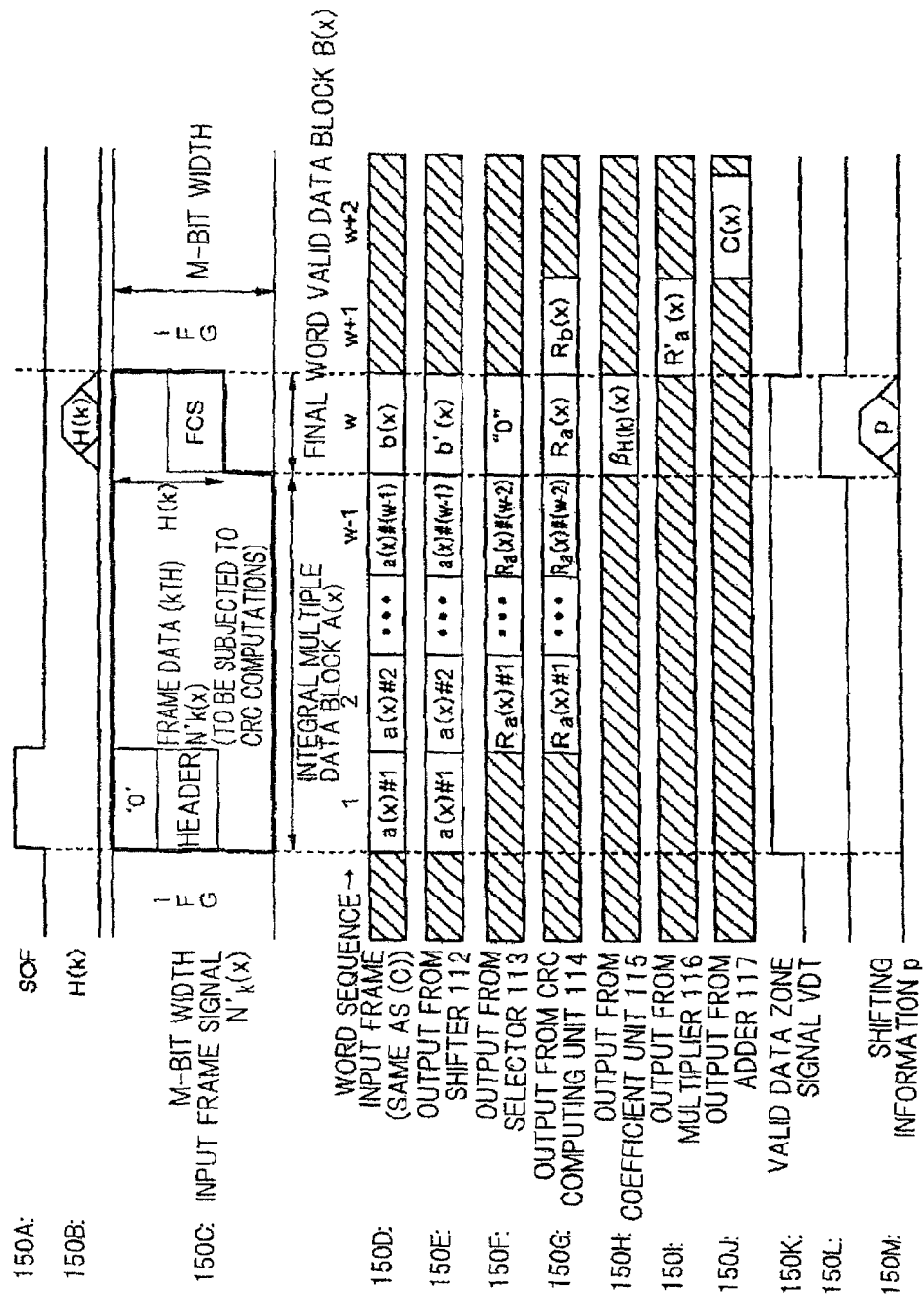

CYCLIC CODE PROCESSING CIRCUIT, NETWORK INTERFACE CARD, AND CYCLIC CODE PROCESSING METHOD

This application is based upon and claims the benefit of priority from Japanese Patent Application No. 2008-235124 filed in Japan Patent Office on Sep. 12, 2008, the contents of which are hereby incorporated by reference.

BACKGROUND OF THE INVENTION (1) Field of the Invention

The present invention relates to a cyclic code computing circuit for generating and checking cyclic codes for use in a process of detecting errors in input data frames.

(2) Description of the Related Art

In recent years, efforts have been in progress to achieve broader bandwidths for frame transmission rates in data communications technologies including 40 Gigabit Ethernet, and 100 Gigabit Ethernet, as specified by the IEEE 802 Committee, USA. "Ethernet" is a registered trademark (No. 1702119). Frame transmission processes for processing electric signals include a frame generation process for converting user data into frames and a frame reception process for extracting user data from frames. If the electric signal processing processes are performed as a serial process, then it is difficult to achieve broader bandwidths because there are limitations on the processing rate. For processing frame signals in broader bandwidths, it is necessary to convert them into parallel frame signals. Converting frame signals into parallel frame signals will hereafter be referred as parallelization.

The data communication technology has seen extensive use of cyclic codes for detecting errors in input data frames. An example of cyclic codes is a CRC (Cyclic Redundancy Check) code. According to the Ethernet, for example, an FCS (Frame Check Sequence) value calculated from the computational result of the CRC code is used to detect errors in headers and user data in frames. The computational result of the CRC code will hereinafter referred to as a CRC value.

For achieving broader bandwidths for frame transmission, it is necessary to carry out at a high speed a process of generating a cyclic code for detecting errors in input data frames and a process of detecting errors in input data frames based on the cyclic code. There has been proposed a technology for performing a cyclic code computing process on parallelized signals having parallel-converted width M (M represents an arbitrary positive integer of 2 or greater). Parallel conversion width M will hereinafter be referred to as the number M of parallel bits or parallel width M.

For parallelizing frames, they are handled as frames wherein the first bit is shifted toward the most significant bit for easy processing, and are converted such that the interframe interval becomes a predetermined interval (IFG; Inter Frame Gap) immediately prior to a transmission channel encoding process such as an 8B/10B encoding process or a 64B/66B encoding process.

If the input frame length n bits (n represents an arbitrary positive integer of 1 or greater) of such frames, wherein the first bit is shifted toward the most significant bit, is not an integral multiple of the number M of parallel bits, then when the input frame is parallelized by the number M of parallel bits, valid data bits smaller than a width of M bits may occur in the final word string of the frame. The final word string of the frame will hereinafter be referred to as a final word and the valid data bits smaller than a width of M bits will be referred to as fractional bits.

When variable-length frames are transmitted such as in the Ethernet widely used in data communications in recent years, it is highly possible for fractional bits to occur. If parallelized frames including fractional bits are processed by a parallel cyclic code computing unit having a width of M bits, then even invalid bits other than the fractional bits fall in a cyclic code computational range, and correct computational results cannot be produced. The same problem arises not only in the generation of a cyclic code, but also in the detection of errors based on a cyclic code.

An example of parallel cyclic code processing circuit for dealing with input frames including fractional bits is disclosed in Non-patent document 1 (Katayama and four others "Scheme for configuring a high-speed and light-weight CRC circuit compatible with variable data length", Journal of Information Processing Society, Information Processing Society, July 2007, Vol. 48, No. 7, pp. 2382-2392).

FIG. 1 shows a configurational example of parallel cyclic code processing circuit disclosed in Non-patent document 1. The parallel cyclic code processing circuit uses a CRC code for a cyclic code and generates a CRC value with respect to an input frame having a width of M bits. In FIG. 1, M represents the Lth power of 2 and L an arbitrary positive integer of 1 or greater.

The parallel CRC code processing circuit comprises controller 1501, CRC computing unit ($2^L$) 1502 having an input width of $2^L$ (L=$\log_2$M) bits, CRC computing unit ($2^{L-1}$) 1503 having an input width of $2^{L-1}$ bits, CRC computing unit ($2^1$) 1504 having an input width of $2^1$ bits, CRC computing unit ($2^0$) 1505 having an input width of $2^0$ bits, data selector ($2^{L-1}$) 1506, data selector ($2^1$) 1507, data selector ($2^0$) 1508, result selector ($2^{L-1}$) 1509, result selector ($2^1$) 1510, and result selector ($2^0$) 1511.

Controller 1501 is supplied with kth (k represents an arbitrary positive integer of 1 or greater) frame signal $N_k(x)$ which is converted into parallel frames having an width of M bits wherein the first bit is shifted toward the most significant bit of parallel M bits, SOF (Start Of Frame) information indicative of the leading position of frame $N_k(x)$, and final word valid information H(k) indicative of the tail end of frame $N_k(x)$.

If H(k)>0, then H(k) represents information that is indicative of final word EOF (End Of Frame) of frame $N_k(x)$ and also that is indicative of the number of valid data bits in the final word. Specifically, if H(k) indicates the position of EOF, then H(k)=1 through M. If H(k)=h (h represents an arbitrary positive integer in the range of $1 \leq h < M$), then it indicates that the final word includes fractional bits of h bits. If H(k)=M, then it indicates that the final word comprises valid data bits in its entirety.

Controller 1501 generates a "result selection signal" and a "data selection signal" from the input signal supplied thereto, and outputs them together with the frame signal. The "result selection signal" output from controller 1501 is supplied to result selectors ($2^{L-1}$) 1509 through ($2^0$) 1511. The "data selection signal" output from controller 1501 is supplied to data selectors ($2^{L-1}$) 1506 through ($2^0$) 1508.

According to the "data selection signal", data selectors ($2^{L-1}$) 1506 through ($2^0$) 1508 output output data ($J_0$ through $J_{L-1}$) respectively to CRC computing units ($2^{L-1}$) 1503 through ($2^0$) 1505. Output data $J_0, J_1, \ldots, J_{L-2}, J_{L-1}$ have respective bit widths $M/2^1, M/2^2, \ldots, M/2^{L-1}, M/2^L$.

CRC computing units ($2^L$) 1502 through ($2^0$) 1505 perform CRC computations on frame signal $N_k(x)$ having a width of M bits which are output from controller 1501 or data ($J_0$ through $J_{L-1}$) having a width of ($2^{L-1}$ through $2^0$) bits which are output from data selectors ($2^{L-1}$) 1506 through ($2^0$) 1508. CRC computing units ($2^L$) 1502 through ($2^0$) 1505 supply respective computational results to result selectors ($2^{L-1}$) 1509 through ($2^0$) 1511.

According to the "result selection signal" from controller 1501, result selectors ($2^{L-1}$) 1509 through ($2^0$) 1511 select signals ($Q'_0$ through $Q'_L$) output from CRC computing units ($2^L$) 1502 through ($2^0$) 1505. The results selected by result selectors ($2^{L-1}$) 1509 through ($2^0$) 1511 are output as desired CRC value $Q_L$ from result selector ($2^0$) 1511.

Operation of the above parallel CRC code processing circuit will be described below with reference to FIG. 2.

In FIG. 2, a figure indicated by the arrow 100A (hereinafter referred to as divided FIG. 100A) shows input frame data, and a figure indicated by the arrow 100B (hereinafter referred to as divided FIG. 100B) shows a computational range of the CRC computing units.

The input frame data shown in divided FIG. 100A represent an example of kth input frame $N_k(x)$ for number M=8 of parallel bits and frame length n=29 bits, with final word valid information H(k)=5. 18-1-1 through 18-4-5 represent data to be subjected to CRC code computations, and 18-4-6 through 18-4-8 represent invalid data not to be subjected to CRC code computations. Since M=8, L=3 (=$\log_2 8$).

As L=3, the numbers of the respective blocks and signals in FIG. 1 are as follows:

Of the output signals from controller 1501, the "data selection signals" are represented by $s_0$, $s_1$, $s_2$, and the "result selection signals" by $m_0$, $m_1$, $m_2$. The blocks of the CRC computing units comprise CRC computing unit ($2^3$) 1502, CRC computing unit ($2^2$) 1503, CRC computing unit ($2^1$) 1504, and CRC computing unit ($2^0$) 1505, and their output signals are represented by $Q'_0$, $Q'_1$, $Q'_2$, $Q'_3$. The blocks of the data selectors comprise data selector ($2^2$) 1506, data selector ($2^1$) 1507, data selector ($2^0$) 1508, and their output signals are represented by $J_0$, $J_1$, $J_2$. The blocks of the result selectors comprise result selector ($2^2$) 1509, result selector ($2^1$) 1510, and result selector ($2^0$) 1511, and their output signals are represented by $Q_0$, $Q_1$, $Q_2$.

When the frame data having a width of 8 bits shown in divided FIG. 100A are input to controller 1501 shown in FIG. 1, controller 1501 generates "data selection signals" ($m_0$="0", $m_1$="0", $m_2$="0") and "result selection signals" ($s_0$="1", $s_1$="1", $s_2$="1") with respect to words 1 through 3 prior to the final word.

CRC computing unit ($2^3$) 1502 performs CRC computations on words 1 through 3 of the frame signal having a width of 8 bits output from controller 1501, and outputs result $Q'_0$ as a computational result. Result $Q'_0$ output from CRC computing unit ($2^3$) 1502 is fed back to the input of CRC computing unit ($2^3$) 1502, and is also supplied to CRC computing unit ($2^2$) 1503 and result selector ($2^2$) 1509.

According to "result selection signal" $m_0$="0" from controller 1501, result selector ($2^2$) 1509 selects result $Q'_0$ from CRC computing unit ($2^3$) 1502, and outputs selected result $Q'_0$ as result $Q_1$. Result $Q_1$ output from result selector ($2^2$) 1509 is supplied to result selector ($2^1$) 1510 and CRC computing unit ($2^1$) 1504.

According to "result selection signal" $m_1$="0" from controller 1501, result selector ($2^1$) 1510 selects result $Q_1$ (since L=3, $Q_{L-2}$=$Q_1$) from result selector ($2^2$) 1509, and outputs selected result $Q_1$ as result $Q_{L-1}$. Result $Q_{L-1}$ output from result selector ($2^1$) 1510 is supplied to result selector ($2^0$) 1511 and CRC computing unit ($2^0$) 1505.

According to "result selection signal" $m_2$="0" from controller 1501, result selector ($2^0$) 1511 selects result $Q_2$ (since L=3, $Q_{L-1}$=$Q_2$) from result selector ($2^1$) 1510, and outputs selected result $Q_2$ as result $Q_L$.

When word 4 of the input data shown in divided FIG. 100A is input to controller 1501 shown in FIG. 1, controller 1501 generates "data selection signals" ($m_0$="1", $m_1$="0", $m_2$="1") and "result selection signals" ($s_0$="1", $s_1$="0", $s_2$="1").

According to "data selection signal" $s_0$="1" from controller 1501, data selector ($2^2$) 1506 outputs high-order 4 bits (18-4-1 through 18-4-4) among the input data having a width of 8 bits in word 4, as signal $J_0$ to CRC computing unit ($2^2$) 1503. Data selector ($2^2$) 1506 also outputs low-order 4 bits (18-4-5 through 18-4-8) in word 4 to data selector ($2^1$) 1507.

If "data selection signal" $s_0$="0", then data selector ($2^2$) 1506 outputs high-order 4 bits (18-4-1 through 18-4-4) among the input data having a width of 8 bits in word 4, as signal $J_0$ to CRC computing unit ($2^2$) 1503. Data selector ($2^2$) 1506 also outputs the high-order 4 bits (18-4-1 through 18-4-4) in word 4 to data selector ($2^1$) 1507.

CRC computing unit ($2^2$) 1503 performs CRC computations on computational result $Q'_0$ for word 3 which is supplied from CRC computing unit ($2^3$) 1502 and signal $J_0$ from data selector ($2^2$) 1506, and outputs result $Q'_1$ to result selector ($2^2$) 1509.

According to "result selection signal" $m_0$="1" from controller 1501, result selector ($2^2$) 1509 outputs input signal $Q'_1$ as result $Q_1$ to CRC computing unit ($2^1$) 1504 and result selector ($2^1$) 1510.

Data selector ($2^1$) 1507 outputs high-order 2 bits (18-4-5 and 18-4-6) among the input data having a width of 4 bits in word 4 as signal $J_1$ to CRC computing unit ($2^1$) 1504. According to "data selection signal" $s_1$="0" (since L=3, $s_{L-2}$=$s_1$) from controller 1501, data selector ($2^1$) 1507 outputs high-order 2 bits (18-4-5 and 18-4-6), instead of low-order 2 bits (18-4-7 and 18-4-8) in word 4, to data selector ($2^0$) 1508.

If "data selection signal" $s_1$="1", then data selector ($2^1$) 1507 outputs high-order 4 bits (18-4-5 and 18-4-6) among the input data having a width of 4 bits in word 4, as signal $J_1$ to CRC computing unit ($2^1$) 1504, and outputs the low-order 2 bits (18-4-7 and 18-4-8) in word 4 to data selector ($2^0$) 1508.

CRC computing unit ($2^1$) 1504 performs CRC computations on output signal $Q_1$ (since L=3, $Q_{L-2}$=$Q_1$) from result selector ($2^2$) 1509 and output signal $J_1$ from data selector ($2^1$) 1507, and outputs result $Q'_2$ to result selector ($2^1$) 1510.

According to "result selection signal" $m_1$="0" (since L=3, $m_{L-2}$=$m_1$) from controller 1501, result selector ($2^1$) 1510 outputs input signal $Q_1$ as result $Q_2$ to CRC computing unit ($2^0$) 1505 and result selector ($2^0$) 1511.

According to "data selection signal" $s_2$="1" (since L=3, $s_{L-1}$=$s_2$) from controller 1501, data selector ($2^0$) 1508 outputs high-order 1 bit (18-4-5) among the input data having a width of 2 bits in word 4, as signal $J_2$ to CRC computing unit ($2^0$) 1505. if $s_2$="0", then data selector ($2^0$) 1508 outputs low-order 1 bit (18-4-6) among the input data having a width of 2 bits in word 4, as signal $J_2$.

CRC computing unit ($2^0$) 1505 performs CRC computations on output signal $Q_2$ from result selector ($2^2$) 1510 and output signal $J_2$ from data selector ($2^0$) 1508, and outputs result $Q'_3$ to result selector ($2^0$) 1511.

According to "result selection signal" $m_2$="1" (since L=3, $m_{L-1}$=$m_2$) from controller 1501, result selector ($2^0$) 1511 outputs input signal $Q'_3$ as CRC computational result $Q_3$.

As shown in divided FIG. 100B, the above parallel CRC code processing circuit computes words 1 through 3 (18-1-1 through 18-3-8) of the input data with CRC computing unit ($2^3$) 1502 which is supplied with data having a width of 8 bits, computes 18-4-1 through 18-4-4 of word 4 of the input data with CRC computing unit ($2^2$) 1503 which is supplied with data having a width of 4 bits, and computes 18-4-5 of word 4 of the input data with CRC computing unit ($2^0$) 1505 which is supplied with data having a width of 1 bit, thereby obtaining proper CRC values of 18-1-1 through 18-4-5 which are to be subjected to CRC code computations in the input data shown in divided FIG. 100A.

However, in order to process the fractional bits (fractional bit length: H(k)) in the final word (word 4) of input frame $N_k(x)$, the parallel CRC code processing circuit disclosed in Non-patent document 1 referred to above requires (L+1) (L=$\log_2$M, M represents the number of parallel bits) CRC computing units (which correspond to CRC computing units ($2^L$) 1502 through ($2^0$) 1505 in FIG. 1). For example, if M=8, then the parallel CRC code processing circuit requires 4 CRC computing units. If M=64, then the parallel CRC code processing circuit requires 7 CRC computing units. If M=512, then the parallel CRC code processing circuit requires 10 CRC computing units.

Therefore, as the number M of parallel bits of the input data increases, the required numbers of CRC computing units 1502 through 1505, data selectors 1506 through 1508, and result selectors 1509 through 1511 increase. As a result, the circuit scale becomes larger.

Furthermore, since CRC computing units 1502 through 1505, data selectors 1506 through 1508, and result selectors 1509 through 1511 are connected in cascade, the number of cascaded connections increases as the number M of parallel bits of the input data increases, resulting in an increase in the processing delay.

As described above, the parallel CRC code processing circuit disclosed in Non-patent document 1 is a parallel cyclic code processing circuit using a CRC code for a cyclic code, and the CRC computing units of the parallel CRC code processing circuit are cyclic code computing units for computing a cyclic code.

SUMMARY OF THE INVENTION

It is an exemplary object of the present invention to provide a parallel cyclic code processing circuit which is capable of solving the problem in which "the circuit scale becomes larger and the processing delay increases as the parallel width of the input data increases".

To achieve the above object, there is provided in accordance with an aspect of the present invention a cyclic code processing circuit that processes bits represented by a predetermined number of parallel bits in parallel to calculate an input data remainder which is a remainder produced when input data made up of a plurality of successive bits are divided by a generator polynomial, the cyclic code processing circuit comprising:

an integral multiple data block remainder calculating unit that calculates an integral multiple data block remainder which is a remainder produced when an integral multiple data block is divided by the generator polynomial by processing the bits represented by the predetermined number of parallel bits in parallel, the integral multiple data block comprising bits positioned closer to a leading end of the input data than a final word which is a word at a tail end of the input data, in the case where a plurality of bits making up the input data are successively divided from the leading end with respect to each word which comprises bits represented by the number of parallel bits;

a final word valid data block remainder calculating unit that calculates a final word valid data block remainder which is a remainder produced when a final word valid data block made up of bits included in the final word of the input data is divided by the generator polynomial; and an input data remainder calculating unit that calculates the input data remainder based on the calculated integral multiple data block remainder and the calculated final word valid data block remainder.

In accordance with another aspect of the present invention, there is also provided a network interface card that processes bits represented by a predetermined number of parallel bits in parallel to calculate an input data remainder which is a remainder produced when input data made up of a plurality of successive bits are divided by a generator polynomial, the network interface card comprising:

an integral multiple data block remainder calculating unit that calculates an integral multiple data block remainder which is a remainder produced when an integral multiple data block is divided by the generator polynomial by processing the bits represented by the predetermined number of parallel bits in parallel, the integral multiple data block comprising bits positioned closer to a leading end of the input data than a final word which is a word at a tail end of the input data, in the case where a plurality of bits making up the input data are successively divided from the leading end with respect to each word which comprises bits represented by the number of parallel bits;

a final word valid data block remainder calculating unit that calculates a final word valid data block remainder which is a remainder produced when a final word valid data block made up of bits included in the final word of the input data is divided by the generator polynomial; and an input data remainder calculating unit that calculates the input data remainder based on the calculated integral multiple data block remainder and the calculated final word valid data block remainder.

In accordance with still another aspect of the present invention, there is also provided a cyclic code processing method of processing bits represented by a predetermined number of parallel bits in parallel to calculate an input data remainder which is a remainder produced when input data made up of a plurality of successive bits are divided by a generator polynomial, the cyclic code processing method comprising:

calculating an integral multiple data block remainder which is a remainder produced when an integral multiple data block is divided by the generator polynomial by processing the bits represented by the predetermined number of parallel bits in parallel, the integral multiple data block comprising bits positioned closer to a leading end of the input data than a final word which is a word at a tail end of the input data, in the case where a plurality of bits making up the input data are successively divided from the leading end with respect to each word which comprises bits represented by the number of parallel bits;

calculating a final word valid data block remainder which is a remainder produced when a final word valid data block made up of bits included in the final word of the input data is divided by the generator polynomial; and calculating the input data remainder based on the calculated integral multiple data block remainder and the calculated final word valid data block remainder.

The above and other objects, features, and advantages of the present invention will become apparent from the following description with reference to the accompanying drawings which illustrate examples of the present invention.

BRIEF DESCRIPTION OF THE DRAWINGS

In the accompanying drawings:

FIG. 15 is a timing chart of inputs and outputs of various components of the parallel CRC checker.

DETAILED DESCRIPTION OF THE EXEMPLARY EMBODIMENTS

Figure 1:
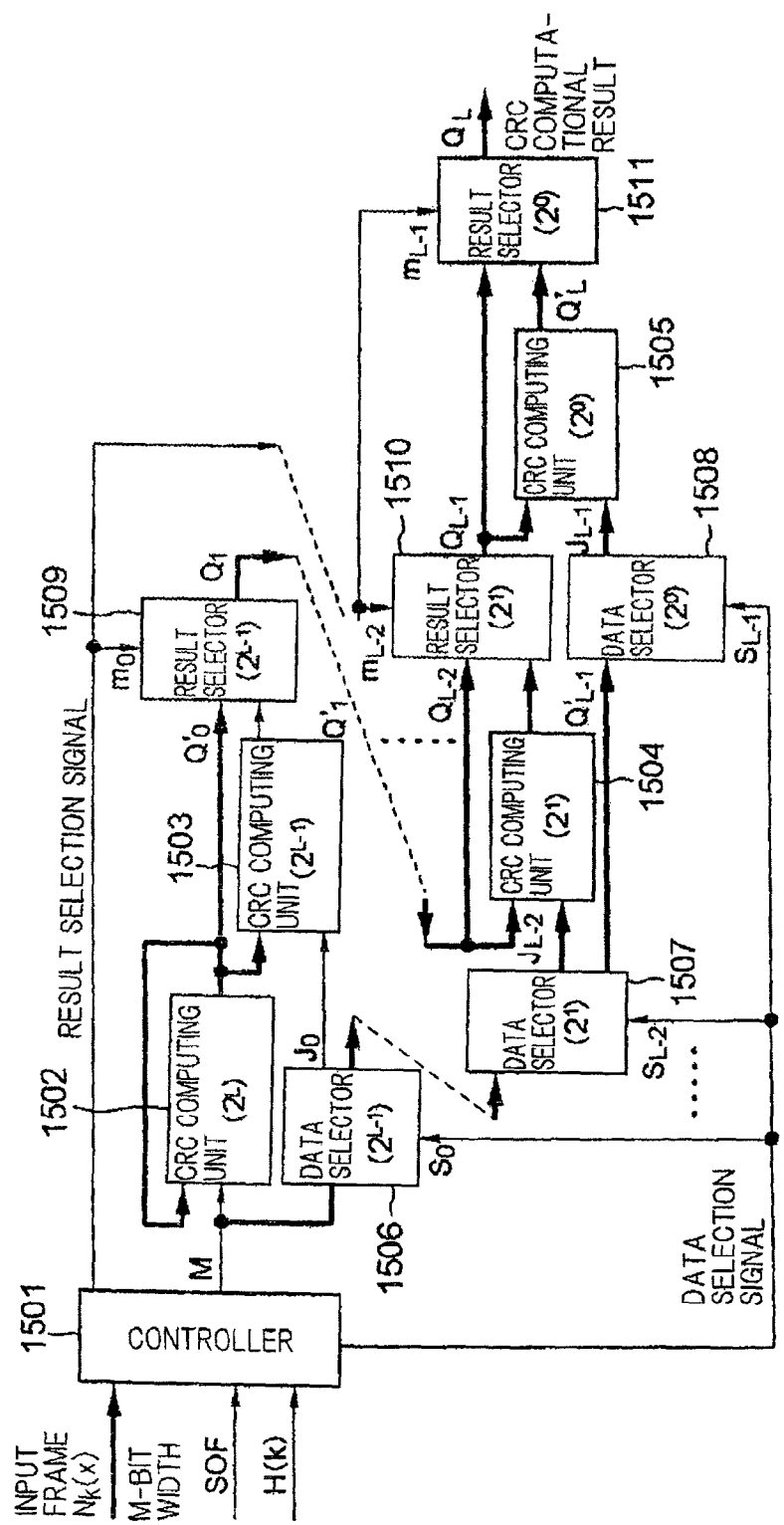
FIG. 1 is a block diagram of an example of a parallel CRC code processing circuit.
Figure 2:
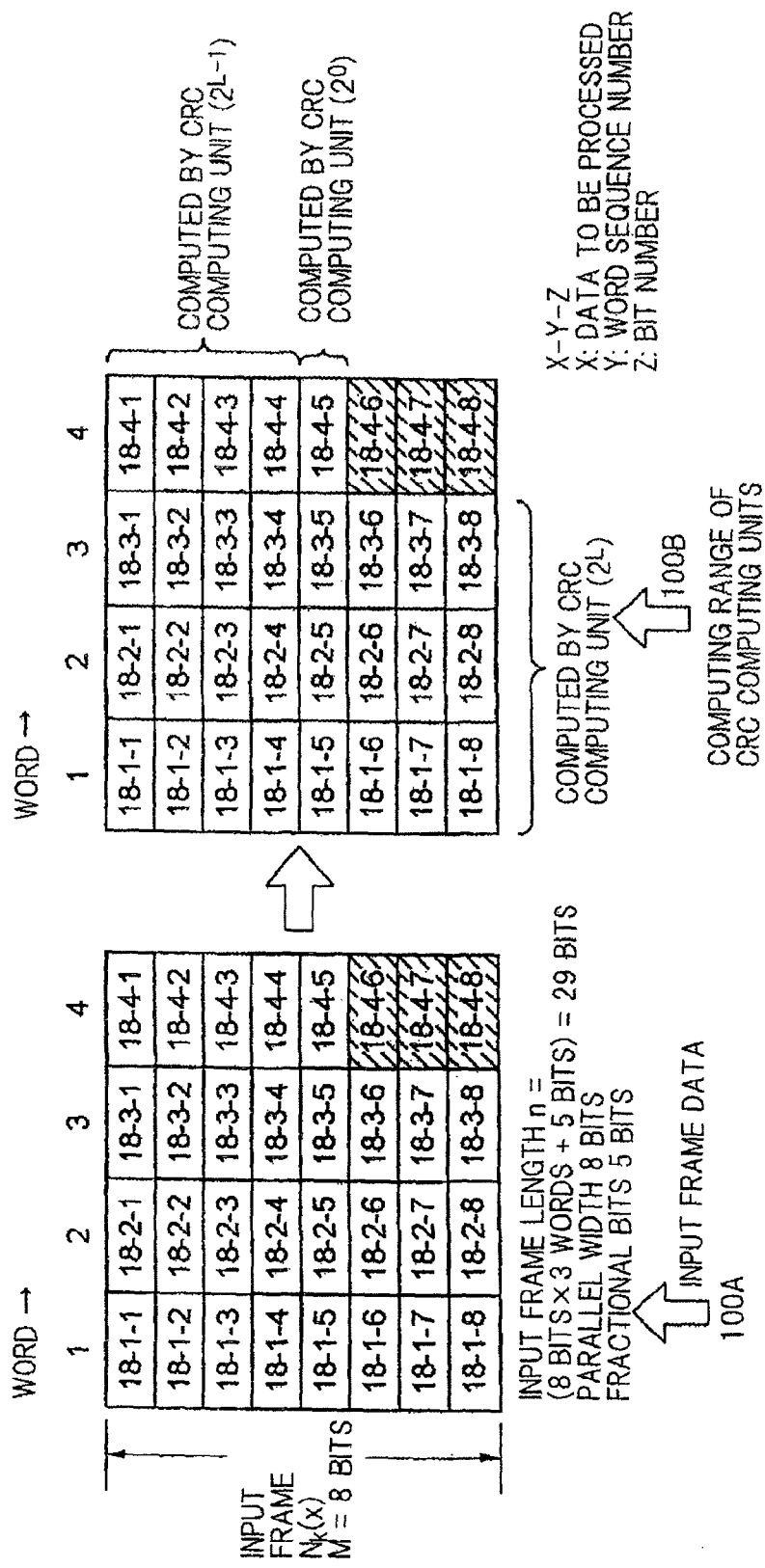
FIG. 2 is a diagram showing input frames and computational ranges of CRC computing units in the parallel CRC code processing circuit shown in FIG. 1.

In accordance with an aspect of the present invention, there is provided a cyclic code processing circuit for processing bits represented by a predetermined number of parallel bits in parallel to calculate an input data remainder which is a remainder produced when input data made up of a plurality of successive bits are divided by a generator polynomial.

The cyclic code processing circuit comprises:

an integral multiple data block remainder calculating unit that calculates an integral multiple data block remainder which is a remainder produced when an integral multiple data block is divided by the generator polynomial by processing the bits represented by the predetermined number of parallel bits in parallel, the integral multiple data block comprising bits positioned closer to the leading end of the input data than a final word which is the word at a tail end of the input data, in the case where a plurality of bits making up the input data are successively divided from the leading end with respect to each word which comprises bits represented by the number of parallel bits;

a final word valid data block remainder calculating unit that calculates a final word valid data block remainder which is a remainder produced when a final word valid data block made up of bits included in the final word of the input data is divided by the generator polynomial; and an input data remainder calculating unit that calculates the input data remainder based on the calculated integral multiple data block remainder and the calculated final word valid data block remainder.

The cyclic code processing circuit independently calculates a final word valid data block remainder and an integral multiple data block remainder. The cyclic code processing circuit can appropriately calculate an integral multiple data block remainder by processing data that makes up the integral multiple data block in parallel per number of parallel bits. As a result, the cyclic code processing circuit can calculate an input data remainder with a low delay.

The cyclic code processing circuit can appropriately calculate a final word valid data block remainder without the need for a plurality of cyclic code computing units having different numbers of parallel bits. In other words, the cyclic code processing circuit can be reduced in scale. Furthermore, the input data remainder can be calculated with a low delay without the need for a plurality of cyclic code computing units connected in cascade.

The input data remainder calculating unit may calculate the input data remainder by adding a product and the final word valid data block remainder, the product being produced by multiplying, by the integral multiple data block remainder, a remainder computing coefficient which is a remainder produced when a polynomial having only terms of power, which have, as an exponent, the number of bits that make up the final word valid data block, is divided by the generator polynomial.

The final word valid data block remainder calculating unit may calculate, as the final word valid data block remainder, a remainder produced when data made up of the number of parallel bits are divided by the generator polynomial, by processing the bits represented by the number of parallel bits in parallel, the data made up of the number of parallel bits including the final word valid data block wherein the bit at the tail end of the final word valid data block is positioned at an end corresponding to a term of a power having 0 as an exponent with all bits that are closer to the other end than the final word valid data block being set to 0.

The final word valid data block remainder can appropriately be calculated by processing the bits represented by the number of parallel bits in parallel. Consequently, the cyclic code processing circuit can calculate the input data remainder with a low delay.

The integral multiple data block remainder calculating unit and the final word valid data block remainder calculating unit may comprise control signal generating unit, shifting unit, selecting unit, and computing unit.

The control signal generating unit outputs the input data per word which comprises the bits represented by the number of parallel bits, successively from the leading end, and, when outputting data making up the final word valid data block, outputs a final word valid data signal indicating that the data which are output make up the final word valid data block, and shifts information representing a number produced by subtracting the number of bits making up the final word valid data block from the number of parallel bits.

The shifting unit receives the data output from the control signal generating unit, outputs data wherein the received data are shifted toward an end of the word by as many bits as the number represented by the shifting information and all bits that are closer to the other end of the word than the shifted data are set to 0 if the shifting information is output from the control signal generating unit, and outputs the received data if the shifting information is not output from the control signal generating unit.

The selecting unit receives data output from a preceding processing process, outputs data made up of as many 0s as the order of the generator polynomial if the final word valid data signal is output from the control signal generating unit, and outputs the received data if the final word valid data signal is not output from the control signal generating unit.

The computing unit processes the bits represented by the number of parallel bits in parallel based on the data output from the shifting unit and the data output from the selecting unit, and outputs data representing the processed bits.

With the above arrangement, both the final word valid data block remainder and the integral multiple data block remainder can be calculated by a single cyclic code computing unit which processes the bits represented by the number of parallel bits in parallel. Therefore, the cyclic code processing circuit can be reduced in scale.

The cyclic code processing circuit should preferably be used in a circuit for adding a frame check sequence (FCS) for performing an error detecting process as the input data remainder to the input data.

The cyclic code processing circuit should preferably be used in a circuit for performing an error detecting process on the input data based on the input data remainder.

The cyclic code processing circuit should preferably be used in a circuit for using the input data remainder in performing an error detecting process on the input data according to a cyclic redundancy check.

In accordance with another aspect of the present invention, there is also provided a network interface card for processing bits represented by a predetermined number of parallel bits in parallel to calculate an input data remainder which is a remainder produced when input data made up of a plurality of successive bits are divided by a generator polynomial.

The network interface card comprises:

an integral multiple data block remainder calculating unit that calculates an integral multiple data block remainder which is a remainder produced when an integral multiple data block is divided by the generator polynomial by processing the bits represented by the predetermined number of parallel bits in parallel, the integral multiple data block comprising bits positioned closer to a leading end of the input data than a final word which is a word at the tail end of the input data, in the case where a plurality of bits making up the input data are successively divided from the leading end with respect to each word which comprises bits represented by the number of parallel bits;

a final word valid data block remainder calculating unit that calculates a final word valid data block remainder which is a remainder produced when a final word valid data block made up of bits included in the final word of the input data is divided by the generator polynomial; and an input data remainder calculating unit that calculates the input data remainder based on the calculated integral multiple data block remainder and the calculated final word valid data block remainder.

The input data remainder calculating unit may calculate the input data remainder by adding a product and the final word valid data block remainder, the product being produced by multiplying, by the integral multiple data block remainder, a remainder computing coefficient which is a remainder produced when a polynomial having only terms of power, which have, as an exponent, the number of bits that make up the final word valid data block, is divided by the generator polynomial.

The final word valid data block remainder calculating unit may calculate, as the final word valid data block remainder, a remainder produced when data of the number of parallel bits are divided by the generator polynomial, by processing the bits represented by the number of parallel bits in parallel, the data of the number of parallel bits including the final word valid data block wherein the bit at the tail end of the final word valid data block is positioned at an end corresponding to a term of a power having 0 as an exponent with all bits closer to the other end than the final word valid data block being set to 0.

In accordance with still another aspect of the present invention, there is also provided a cyclic code processing method of processing bits represented by a predetermined number of parallel bits in parallel to calculate an input data remainder which is a remainder produced when input data made up of a plurality of successive bits are divided by a generator polynomial.

The cyclic code processing method comprises the steps of:

calculating an integral multiple data block remainder which is a remainder produced when an integral multiple data block is divided by the generator polynomial by processing the bits represented by the predetermined number of parallel bits in parallel, the integral multiple data block comprising bits positioned closer to a leading end of the input data than a final word which is a word at the tail end of the input data, in the case where a plurality of bits making up the input data are successively divided from the leading end with respect to each word which comprises bits represented by the number of parallel bits;

calculating a final word valid data block remainder which is a remainder produced when a final word valid data block made up of bits included in the final word of the input data is divided by the generator polynomial; and calculating the input data remainder based on the calculated integral multiple data block remainder and the calculated final word valid data block remainder.

The step of calculating an input data remainder may comprise the step of:

calculating an input data remainder by adding a product and the final word valid data block remainder, the product being produced by multiplying, by the integral multiple data block remainder, a remainder computing coefficient which is a remainder produced when a polynomial having only terms of power, which have, as an exponent, the number of bits that make up the final word valid data block, is divided by the generator polynomial.

The step of calculating a final word valid data block remainder may comprise the step of:

calculating a remainder produced when data made up of the number of parallel bits are divided by the generator polynomial as the final word valid data block remainder, by processing the bits represented by the number of parallel bits in parallel, the data of the number of parallel bits including the final word valid data block wherein the bit at the tail end of the final word valid data block is positioned at an end corresponding to a term of a power having 0 as an exponent with all bits that are closer to the other end than the final word valid data block being set to 0.

The network interface card and the cyclic code processing method described above also operate in the same manner as the cyclic code processing referred to above, and hence can achieve the object of the present invention described above.

Exemplary embodiments of a cyclic code processing circuit, a network interface card, and a cyclic code processing method according to the present invention will be described below with reference to FIGS. 3 through 16. In the exemplary embodiments, a CRC code is used as a cyclic code as with the parallel cyclic code processing circuit disclosed in Non-patent document 1 for illustrative purposes. However, the present invention is not limited to the CRC code, but is also applicable to other cyclic codes than the CRC code.

<Derivation of Basic Equations>

First, the derivation of equations as a basis for the present invention (basic equations) will be described below.

To determine a CRC value of input frame (input data) $N_k(x)$ comprising a plurality of successive bits (the number of bits is represented by n), $N_k(x)$ which is to be subjected to CRC code computations can be expressed by equation (1), shown below, using integral multiple data block $A(x)$ and final word valid data block $B(x)$ where x represents a variable of a polynomial. The input frame is expressed by polynomial $N_k(x)$ whose coefficients are represented by the bits of the input frame. Similarly, integral multiple data block $A(x)$, final word valid data block $B(x)$, and other data to be described later are also expressed by a polynomial whose coefficients are represented by the bits of those data.

Integral multiple data block $A(x)$ comprises data of bits positioned closer to the leading end of input frame $N_k(x)$ than a final word which is a word at the tail end, in the case where a plurality of bits are successively divided from the leading end with respect to each word which comprises bits represented by the number M of parallel bits among a plurality of bits which make up input frame $N_k(x)$. Final word valid data block $B(x)$ comprises data of bits contained in the final word of input frame $N_k(x)$ (i.e., bits other than integral multiple data block $A(x)$ of input frame $N_k(x)$). Therefore, number $H(k)$ of bits that make up final word valid data block $B(x)$ has a value ranging from 1 through M. If $H(k) \neq M$, then this indicates that the final word contains fractional bits (bits in the range from 1 through M−1). If $H(k)=M$, then this indicates the final word does not contain fractional bits, but contains valid data bits in its entirety.

$$N_k(x) = A(x) \cdot x^{H(k)} + B(x) \tag{1}$$

In the present specification, "+" in the equations represents an addition (exclusive-ORing) as a modulo-2 operation, and "mod" represents the remainder of a division as a modulo-2 operation. $H(k)$ represents the length of final word valid data block $B(x)$ (the number of bits (the number of final word valid bits) making up final word valid data block $B(x)$) of a kth input frame (k represents an arbitrary positive integer), $G(x)$ represents a generator polynomial, and d represents the degree of $G(x)$.

If it is assumed that a CRC value of integral multiple data block $A(x)$ (integral multiple data block remainder) is indicated by $Ra(x)$, then $Ra(x)$ is expressed by the following equation (2):

$$Ra(x) = [A(x) \cdot x^d] \bmod G(x) \tag{2}$$

If it is assumed that a CRC value of input frame $N_k(x)$ (input frame remainder) is indicated by $R(x)$, then $R(x)$ is expressed by the following equation (3):

$$R(x) = [N_k(x) \cdot x^d] \bmod G(x) \tag{3}$$

From the equations (2), (3), the following equation (4) is obtained:

$$R(x) = \{[A(x) \cdot x^d \cdot x^{H(k)}] + [B(x) \cdot x^d]\} \bmod G(x) \tag{4}$$

Based on the equation (2), the equation (4) can be expressed by the following equation (5):

$$R(x) = \{[Ra(x) \cdot x^{H(k)}] + [B(x) \cdot x^d]\} \bmod G(x) \tag{5}$$

The equation (5) can be expressed by the following equation (6):

$$R(x) = \{Ra(x) \cdot [x^{H(k)}] \bmod G(x)\} + \{[B(x) \cdot x^d] \bmod G(x)\} \tag{6}$$

Since $[x^{H(k)}] \bmod G(x)$ in the equation (6) can be computed in advance, the equation (6) can be expressed as follows:

Remainder computing coefficient $\beta_{H(k)}(x)$ represents the remainder produced when a polynomial (i.e. $x^{H(k)}$), that has only terms of power which have, as an exponent, number $H(k)$ of bits making up the final word valid data block $B(x)$ is divided by generator polynomial $G(x)$.

$$\beta_{H(k)}(x) = [x^{H(k)}] \bmod G(x) \tag{7}$$

Putting equation (7) into equation (6) and replacing $[B(x) x^d] \bmod G(x)$ with $Rb(x)$, the following equation (8) is obtained:

$$R(x) = \{[Ra(x) \beta_{H(k)}(x)]\} + Rb(x) \tag{8}$$

Since $\{[Ra(x) \beta_{H(k)}(x)]\}$ in equation (8) represents a multiplication in a Galois field, the equation (8) is expressed as follows:

$$R(x) = \{[Ra(x) \beta_{H(k)}(x)] \bmod G(x)\} + Rb(x) \tag{9}$$

It can be seen from equation (9) that CRC value $R(x)$ of $N_k(x)$ can be determined by the following steps (1) through (6):

(1) Integral multiple data block remainder $Ra(x)$ is calculated by an M-bit-input CRC computing circuit which processes the bits represented by the number M of parallel bits in a parallel fashion.

(2) Remainder computing coefficient $\beta_{H(k)}(x)$ is calculated based on number $H(k)$ of final word valid bits.

(3) $B(x)$ made up of bits represented by number $H(k)$ of final word valid bits is shifted toward the least significant bit by p bits ($p = M - H(k)$).

(4) Based on the data shifted in (3), final word valid data block remainder $Rb(x)$ is calculated by the M-bit-input CRC computing circuit.

(5) $Ra(x)$ and $\beta_{H(k)}(x)$ are multiplied (in a Galois field).

(6) The product produced in (5) and $Rb(x)$ are added (added in a Galois field: exclusive-ORed) to determine a CRC value of $N_k(x)$ (input data remainder).

According to the above steps, CRC value $R(x)$ of $N_k(x)$ can be determined without the need for a CRC computing circuit to which bits represented by other than the number M of parallel bits are input. In other words, even if the parallel width of input data increases, the circuit scale is prevented from becoming excessively large, and any processing delay is also prevented from becoming excessively large.

The derivation of basic equations involved in an error-detecting CRC code processing process will be described below.

For detecting an error included in input frame $N_k'(x)$, a CRC code computational range is set to cover $N_k'(x)$ from its leading end to its tail end. In this manner, an error in input frame $N_k'(x)$ can be detected from the computational result.

Since $N_k'(x) = N_k(x) \cdot x^d + R(x)$ and CRC value $R(x)$ refer to the remainder produced when $N_k(x)$ is divided by generator polynomial $G(x)$, $N_k'(x)$ represents a multiple of generator polynomial $G(x)$. In other words, the remainder produced when $N_k'(x)$ is divided by $G(x)$ is necessarily "0". If the remainder is other than "0", then it means that $N_k'(x)$ contains an error.

The above statement is expressed by equations ((10) through (12) shown below. In the equations, $A(x)$ represents an integral multiple data block having a parallel width of M bits of $N_k'(x)$, and $B(x)$ a final word valid data block of $N_k'(x)$.

$$N_k'(x) = A(x) 19\, x^{H(k)} + B(x) \tag{10}$$

$$Ra(x) = [A(x)] \bmod G(x) \tag{11}$$

$$C(x) = [N_k'(x)] \bmod G(x) \tag{12}$$

The equations (10) through (12) can be expressed by the equation (13):

$$C(x) = \{Ra(x) \cdot [x^{H(k)}] \bmod G(x)\} + \{[B(x)] \bmod G(x)\} \quad (13)$$

Expressing [B(x)] mode G(x) as Rb(x) and replacing $[x^{H(k)}]$ mod G(x) with the equation (7) in the equation (13), the equation (13) is expressed by the following equation (14):

$$C(x) = \{Ra(x) \cdot \beta_{H(k)}(x)\} + Rb(x) \quad (14)$$

Since $\{Ra(x) \cdot \beta_{H(k)}(x)\}$ in the equation (14) represents a multiplication in a Galois field, the equation (14) is expressed as follows:

$$C(x) = \{[Ra(x) \cdot \beta_{H(k)}(x)] \bmod G(x)\} + Rb(x) \quad (15)$$

C(x) according to the equation (15) represents the CRC value of input frame $N_k'(x)$. If C(x)="0", then it can be said that input frame $N_k'(x)$ is free of errors. It can be seen from the equation (15) that an error detecting process can be performed on input frame $N_k'(x)$ in accordance with the sequence based on the equation (9).

Consequently, an error detecting process can be performed on input frame $N_k'(x)$ without the need for a CRC computing circuit to which represented by other than the number M of parallel bits are input. In other words, even if the parallel width of input data increases, the circuit scale is prevented from becoming excessively large, and any processing delay is also prevented from becoming excessively large.

Communication systems typified by the Ethernet do not use a CRC value itself, but often uses an FCS value calculated from a CRC value in an error detecting process.

1st Exemplary Embodiment (Configuration)

A first exemplary embodiment of the present invention will be described in detail below with reference to FIGS. 3 and 4.

Figure 3:
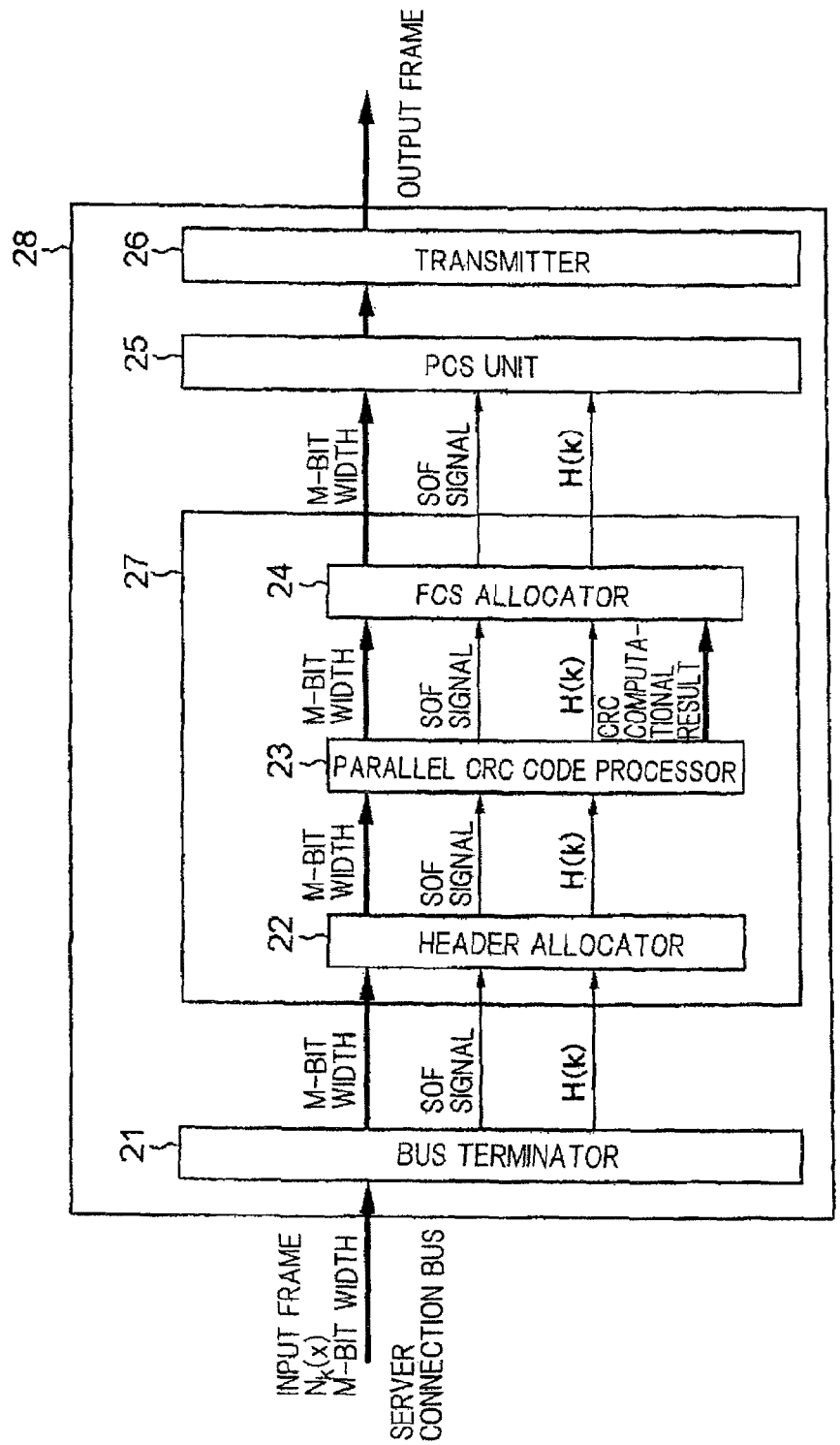
FIG. 3 is a block diagram of a network interface card according to a first exemplary embodiment of the present invention.

FIG. 3 is a block diagram of a transmitting function of network interface card (NIC) 28 according to a first exemplary embodiment of the present invention. Network interface card 28 is installed in a server apparatus or computer apparatus, not shown, and performs a process for transmitting and receiving frames.

Network interface card 28 comprises bus terminator 21, header allocator 22, parallel CRC code processor 23, FCS allocator 24, PCS (Physical Coding Sublayer) unit 25, and transmitter 26.

Bus terminator 21 is connected to a CPU bus in a server by a server connection bus. Transmitter 26 is connected to a transmission channel (at the right end of FIG. 3) for transmitting frames to an external circuit. Network interface card 28 allocates a frame header and an FCS value to a frame (an input frame, input data) input from the server, and transmits the frame to the transmission channel.

Bus terminator 21 receives a frame sent from the server. The frame has a width of M bits. Specifically, the frame is received per word that comprises bits represented by the number M of parallel bits. The most significant bit at an end of one word stores a bit near the leading end of the frame. The least significant bit at the other end of the word stores a bit near the tail end of the frame.

Bus terminator 21 generates, from the frame sent from the server, an SOF signal indicative of the leading end of the frame and final word valid data signal H(k) indicative of the final end (tail end) of the frame, and outputs these signals together with the frame having a width of M bits to header allocator 22. If H(k)>0, then H(k) represents information indicative of a final word EOF position of frame $N_k(x)$ and also indicative of the number of valid data bits in the final word. Specifically, if H(k) indicates the position of EOF, then H(k)=1 through M. If H(k)=h (h represents an arbitrary positive integer in the range of 1≦h<M), then it indicates that the final word includes fractional bits of h bits. If H(k)=M, then it indicates that the final word comprises valid data bits in its entirety, not fractional bits.

Bus terminator 21 outputs an SOF signal when it outputs the leading word of the frame. Bus terminator 21 also outputs final word valid data signal H(k) when it outputs final word valid data block B(x) at the tail end of the frame.

Header allocator 22 allocates a frame header to the frame output from bus terminator 21, and outputs the frame with the allocated frame header, the SOF signal, and final word valid data signal H(k) to parallel CRC code processor 23.

As the frame header is allocated to the frame, the number of bits of the frame increases. As a result, final word valid data block B(x) also changes. Therefore, header allocator 22 updates the value of final word valid data signal H(k) into the number of bits of final word valid data block B(x) (the number of final word valid bits) after the frame header is allocated, and then outputs H(k).

Parallel CRC code processor 23 generates a CRC value for the frame having a width of M bits output from header allocator 22.

FCS allocator 24 allocates the CRC value generated by parallel CRC code processor 23 as an FCS value to the final end of the frame (the tail end of the frame). When the FCS value is allocated to the final end of the frame, the frame length (the number of bits) increases, and, as a result, final word valid data block B(x) also changes. Therefore, FCS allocator 24 updates the value of final word valid data signal H(k) into the number of bits of final word valid data block B(x) after the FCS value is allocated, and then outputs H(k).

Header allocator 22, parallel CRC code processor 23, and FCS allocator 24 jointly make up MAC transmission processor 27 for generating a transmission MAC frame.

PCS unit 25 performs a transmission channel encoding process on the frame having a width of Mbits from FCS allocator 24. The transmission channel encoding process is a encoding process for transmitting the data over the transmission channel, such as an 8B/10B encoding process or a 64B/66B encoding process.

Transmitter 26 converts the frame output from PCS unit 25 from parallel data into serial data, and outputs the converted frame to the transmission channel.

In the present exemplary embodiment, the parallel cyclic code processing circuit according to the present invention is applied to parallel CRC code processor 23.

Configurational details of parallel CRC code processor 23 will be described below with reference to FIG. 4.

As described above, parallel CRC code processor 23 receives a frame per word that comprises bits represented by the number M of parallel bits. Bits that are successively arranged from the most significant bit to the least significant bit of one word store respective bits that are successively arranged from the leading end to the tail end of the frame.

In order to obtain a CRC value of input frame $N_k(x)$ (k represents an arbitrary positive integer of 1 or greater), parallel CRC code processor 23 operates as follows: If number n of bits of input frame $N_k(x)$ that is to be subjected to CRC code computations is not an integral multiple of the number M of parallel bits, i.e., if a final word valid data block comprises fractional bits, then parallel CRC code processor 23 independently calculates CRC value (integral multiple data block remainder) Ra(x) of integral multiple data block A(x) which comprises data made up of bits other than a final word valid data block of the input frame (data made up of as many successive bits including a leading bit as an integral multiple of the number M of parallel bits), and CRC value (final word valid data block remainder) Rb(x) of final word valid data block B(x) represented by number H(k) of final word valid bits.

Parallel CRC code processor 23 calculates CRC value Ra(x) with a CRC computing unit having a width of M bits for processing one word in a parallel fashion.

Parallel CRC code processor 23 generates data (word) b'(x) having a width of M bits wherein final word valid data block B(x) is shifted toward the least significant bit by p (p=M−H(k)) bits and all bits that are closer to the most significant bit than the shifted data are set to "0", and inputs generated data b'(x) to the CRC computing unit having the width of M bits to enable the latter to calculate CRC computational result Rb(x), Data b'(x) refer to data wherein the bit at the tail end of final word valid data block B(x) is positioned at an end (the least significant bit) corresponding to a term of a power having 0 as an exponent and all bits that are closer to the other end (the most significant bit) than final word valid data block B(x) are set to "0".

Parallel CRC code processor 23 multiplies CRC value Ra(x) and coefficient $\beta_{H(k)}(x)$ corresponding to number H(k) of final word valid bits (multiplies them in a Galois field), and adds the result of the multiplication, i.e., product R'a(x), and CRC computational result Rb(x) (adds them in a Galois field, i.e., exclusive-ORs them).

According to the above process, a parallel CRC code processing process can be carried out without the need for an increase in the number of CRC computing units. The above process is performed in accordance with the sequence based on the equation (9).

Figure 4:
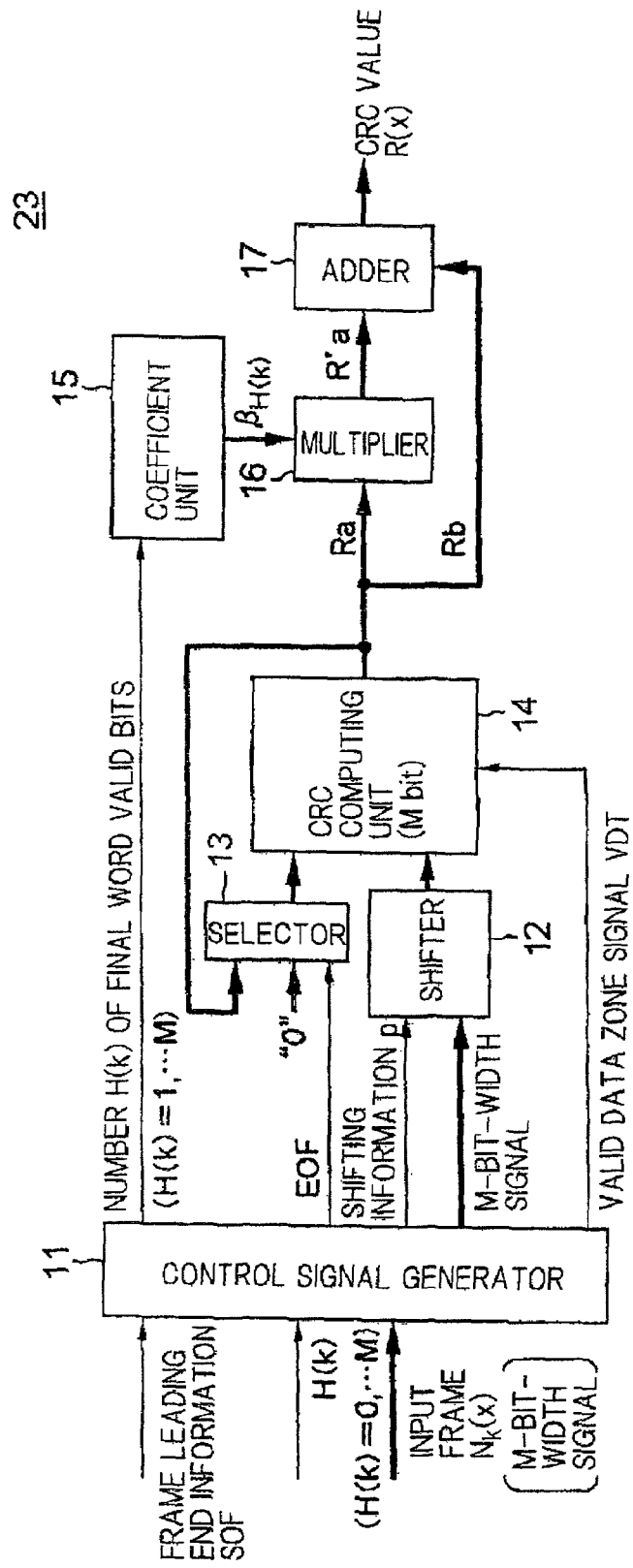
FIG. 4 is a block diagram of a parallel CRC code processor shown in FIG. 3.

As shown in FIG. 4, parallel CRC code processor 23 comprises control signal generator (control signal generating unit) 11, shifter (shifting unit) 12, selector (selecting unit) 13, CRC computing unit (computing unit) 14, coefficient unit 15, multiplier 16, and adder 17.

Control signal generator 11, shifter 12, selector 13, and CRC computing unit 14 make up an integral multiple data block remainder computing unit (an integral multiple data block remainder computing step) and a final word valid data block remainder computing unit (a final word valid data block remainder computing step). Coefficient unit 15, multiplier 16, and adder 17 jointly make up an input data remainder computing unit (an input data remainder computing step).

Control signal generator 11 outputs input frame (input data) $N_k(x)$ per word (bits represented by the number M of parallel bits) successively from the leading bit. Control signal generator 11 generates an EOF signal, shifting information, and valid data zone signal VDT, which serve as a control signal, from an SOF signal and number H(k) of fractional bits.

If the data to be output represent a final word of the frame data (H(k)≠0), then control signal generator 11 generates an EOF signal indicative of the final end (tail end) of the frame, and outputs the generated EOF signal to selector 13.

Control signal generator 11 generates shifting information p (p=M−H(k)) by subtracting H(k) from the number M of parallel bits, and outputs generated shifting information p to shifter 12. Furthermore, control signal generator 11 outputs received signal H(k) to coefficient unit 15. Since the value of H(k) output to coefficient unit 15 is a value at the EOF position of the frame, it ranges from 1 through M.

If the input frame length is an integral multiple of the number M of parallel bits, then control signal generator 11 receives final word valid data signal H(k) (H(k)=M). In this case, control signal generator 11 generates an EOF signal indicative of the final end of the frame, and outputs the generated EOF signal to selector 13. Moreover, control signal generator 11 generates shifting information p=0 (p=M−H(k)) by subtracting H(k) from the number M of parallel bits, and outputs generated shifting information p to shifter 12. Furthermore, control signal generator 11 outputs received signal H(k) (H(k)=M) to coefficient unit 15.

While outputting data including at least a portion of the input data, control signal generator 11 generates valid data zone signal VDT and outputs generated valid data zone signal VDT to CRC computing unit 14.

When shifting information p output from control signal generator 11 is input to shifter 12, shifter 12 shifts the signal having a width of M bits that is output from control signal generator 11 toward the least significant bit (an end corresponding to an item of a power which has 0 as an exponent) by as many bits as the number indicated by shifting information p (p=M−H(k)) output from control signal generator 11. Furthermore, shifter 12 sets "0" in p bits that are closer to the most significant bit (the other end) and which are generated by the shifting process (all bits closer to the most significant bit than the shifted data).

Therefore, data to be computed by CRC computing unit 14 represent final word valid data block B(x) which comprises bits represented by number H(k) of final word valid bits. In other words, a CRC computational result that is representative of final word valid data block B(x) which comprises bits represented by number H(k) of final word valid bits can be processed by CRC computing unit 14 which is supplied with M bits.

When the EOF signal is input from control signal generator 11 to selector 13, selector 13 outputs data comprising as many "0"s as order d of generator polynomial G(x) ("0" data) to CRC computing unit 14. If no EOF signal is input from control signal generator 11 to selector 13, then selector 13 outputs the computational result in the preceding cycle from CRC computing unit 14 (a computational result output from the computing process on the preceding input word) to CRC computing unit 14.

CRC computing unit 14 performs CRC computations. Specifically, CRC computing unit 14 performs parallel CRC computations on the bits represented by the number M of parallel bits based on the CRC value having a width of d bits in the preceding cycle (or "0" data) which is output from selector 13 and the data having a width of M bits which is output from shifter 12, and outputs data representative of the result of the computations (computational result). Specifically, CRC computing unit 14 adds data produced when the data output from selector 13 is multiplied by $x^{M-d}$ to the data output from shifter 12, and calculates a remainder produced when data produced by multiplying the sum by $x^d$ is divided by generator polynomial G(x), as a computational result.

Coefficient unit 15 stores in advance M coefficients (remainder computing coefficients) $\beta_{H(k)}(x)$ (H(k)=1 through M) calculated according to the above equation (7). When signal H(k) output from control signal generator 11 is input to coefficient unit 15, coefficient unit 15 outputs coefficient $\beta_{H(k)}(x)$ depending on signal H(k).

Multiplier 16 multiplies coefficient $\beta_{H(k)}(x)$ output from coefficient unit 15 and CRC value Ra(x) of integral multiple data block A(x) output from CRC computing unit 14 (multiplies them in a Galois field), and outputs the result of the multiplication, i.e., product R'a(x), to adder 17.

Adder 17 adds output R'a(x) from multiplier 16 and CRC value Rb(x) of final word valid data block B(x) (adds them in a Galois field, i.e., exclusive-ORs them).

(Operation)

Operation of network interface card 28 which is constructed as described above will be described below.

When bus terminator 21 shown in FIG. 3 receives a frame from a higher layer, it generates an SOF signal indicative of the leading end of the frame and final word valid data signal H(k) indicative of the final end of the frame, and outputs the generated SOF signal and final word valid data signal H(k), together with the frame having a width of M bits, to header allocator 22. Specifically, when bus terminator 21 outputs a first word (which comprises M bits) of the frame, it outputs the SOF signal, and when bus terminator 21 outputs a word at the tail end of the frame (which comprises M bits including final word valid data block B(x)), it outputs the number of bits of final word valid data block B(x) (the number of final word valid bits) as final word valid data signal H(k).

Header allocator 22 allocates a frame header to the input frame, and updates the SOF signal and final word valid data signal H(k). When header allocator 22 outputs first M bits of the frame after the header has been allocated thereto, it outputs the SOF signal. When header allocator 22 outputs final word valid data block B(x) at the tail end of the frame, it outputs final word valid data signal H(k) (see 500A in FIG. 5).

Parallel CRC code processor 23 calculates CRC values of frames $N_k(x)$, $N_{(k+1)}(x)$ output from header allocator 22, and outputs the calculated CRC values to FCS allocator 24. Frames $N_k(x)$, $N_{(k+1)}(x)$ are schematically shown by bold lines at 500A in FIG. 5.

Figure 5:
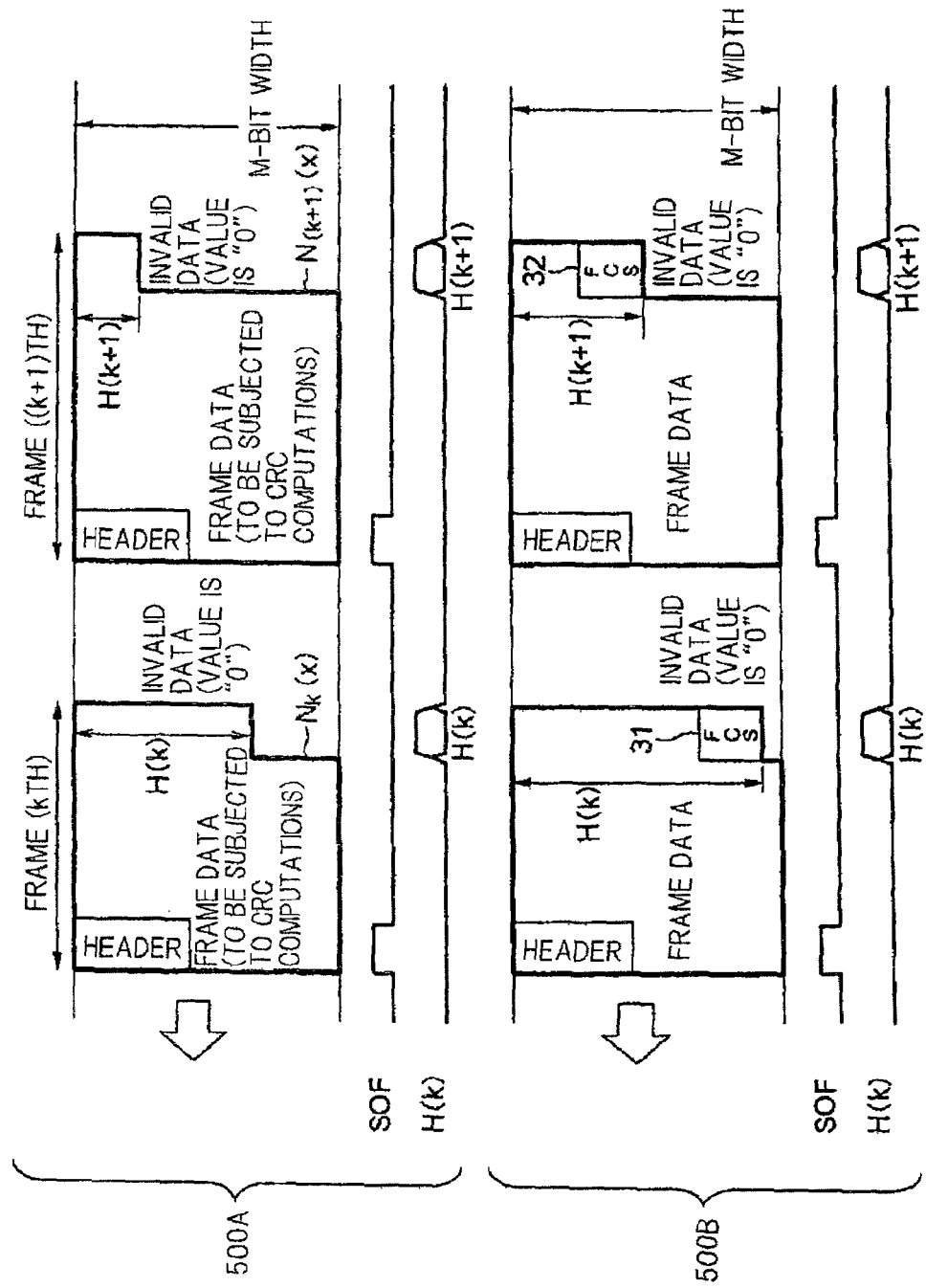
FIG. 5 is a timing chart of input signals and output signals of the parallel CRC code processor and an FCS allocator shown in FIG. 3.

FCS allocator 24 allocates the CRC values output from parallel CRC code processor 23 as FCSs 31, 32 to the frame, as shown in FIG. 5, and updates H(k). When FCS allocator 24 outputs the first M bits of the frame after the FCS has been allocated, it outputs an SOF signal to PCS unit 25, and when FCS allocator 24 outputs final word valid data block B(x) at the final end of the frame, it outputs final word valid data signal H(k) to PCS unit 25 (see 500B in FIG. 5).

PCS unit 25 performs a transmission channel encoding process on the frame from FCS allocator 24, and outputs the encoded data to transmitter 26. Transmitter 26 converts the frame having a width of M bits which is output from PCS unit 25 from parallel data into serial data, and outputs the converted frame to the transmission channel.

Operation of parallel CRC code processor 23 will be described in greater detail below.

Figure 6:
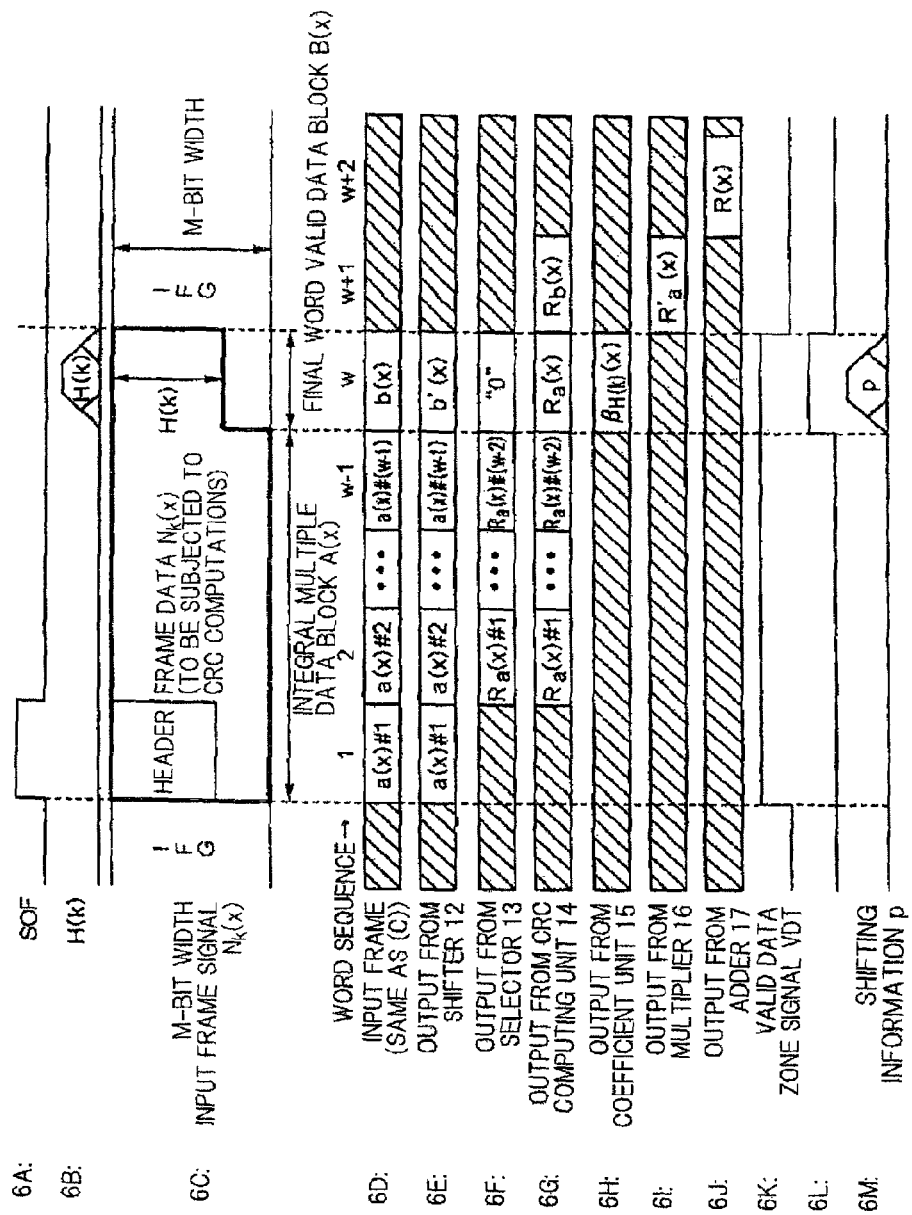
FIG. 6 is a timing chart of inputs and outputs of various components of the parallel CRC code processor.
Figure 7A:
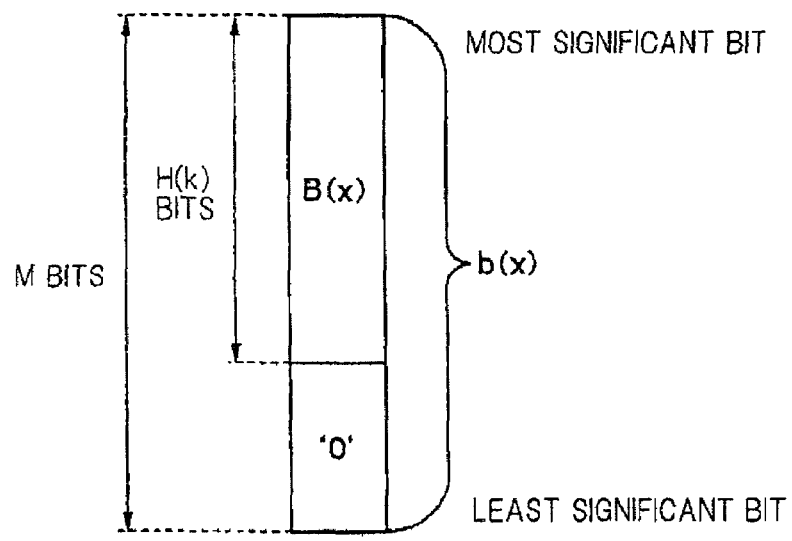
FIG. 7A is a diagram showing a shifting process performed by a shifter shown in FIG. 4.
Figure 7B:
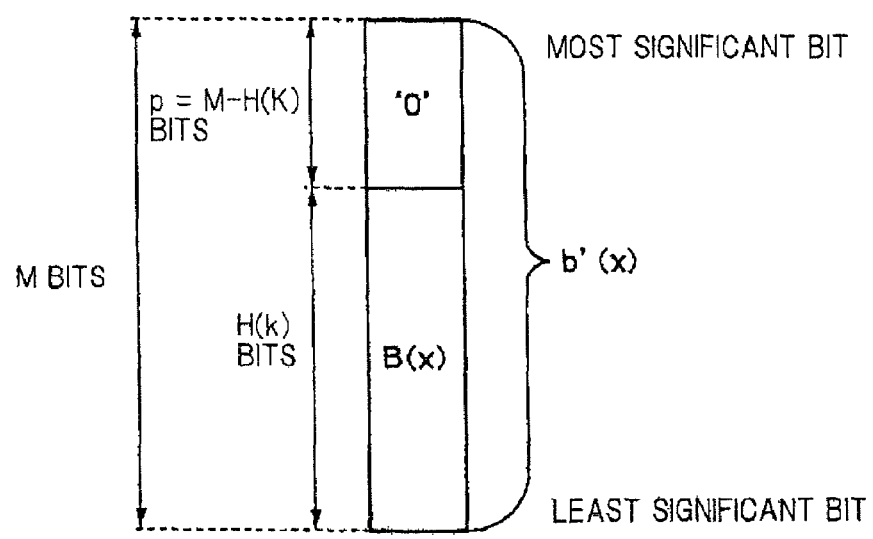
FIG. 7B is a diagram showing a shifting process performed by a shifter shown in FIG. 4.

FIG. 6 is a timing chart of inputs and outputs of various components of parallel CRC code processor 23.

In FIG. 6, reference characters 6A through 6C indicate an SOF signal, signal H(k), and a frame, respectively, which are input to control signal generator 11, and reference characters 6D words (sequences) of the frame input to control signal generator 11. Each of the words comprises M bits. Reference characters 6E through 6J indicate respective outputs from shifter 12, selector 13, CRC computing unit 14, coefficient unit 15, multiplier 16, and adder 17, and reference characters 6K through 6M indicate signal VDT, an EOM signal, and shifting information p, respectively.

As indicated by reference characters 6A through 6D in FIG. 6, the frame having the width of M bits which is to be subjected to CRC code computations, the SOF signal indicative of the leading end of the frame, and final word valid signal H(k) indicative of the number of final word valid bits at the tail end of the data, which are output from header allocator 22, are input to control signal generator 11.

As indicated by reference characters 6C in FIG. 6, the input frame includes integral multiple data block A(x) comprising as many bits as an integral multiple of the number M of parallel bits and final word valid data block B(x) comprising as many bits as number H(k) of final word valid bits.

Reference characters 6D in FIG. 6 schematically show words of the input frame. Each word comprises as many bits as the number M of parallel bits. A word is also referred to as a word sequence. First word a(x)#1 through (w−1)th word a(x)#(w−1) make up integral multiple data block A(x) and wth word b(x) is a final word which includes final word valid data block B(x).

When the frame and the signals indicated by reference characters 6A through 6D in FIG. 6 are input to control signal generator 11, control signal generator 11 sets valid data zone signal VDT to a signal representative of "valid (indicating that bits of the frame are being input)" while it is outputting the data of the input frame, and outputs valid data zone signal VDT to CRC computing unit 14.

After the first word of the input frame has been input and until the (w−1)th word is input, control signal generator 11 sets the frame tail end signal (EOF signal) to a signal representative of "L: Low", and outputs the EOF signal to selector 13.

Reference characters 6K through 6M in FIG. 6 indicate signals generated by control signal generator 11. Reference characters 6K indicate valid data zone signal VDT whose "H" level represents "valid" and whose "L" level represents "invalid (indicating that bits of the frame are not being input)". Reference characters 6L in FIG. 6 indicate an EOF signal whose "H" level represents the final word (the wth word) of the frame and whose "L" level does not represent the final word (the wth word) of the frame.

Shifter 12 shifts the input frame having the width of M bits (see reference characters 6D in FIG. 6) depending on shifting information p from control signal generator 11. The first word through (w−1)th word of the input frame having the width of M bits (see reference characters 6D in FIG. 6) do not include final word valid data block B(x). Therefore, shifter 12 does not shift them, but outputs first word a(x)#1 through (w−1)th word a(x)#(w−1) successively to CRC computing unit 14.

Depending on the EOF signal indicated by reference characters 6D in FIG. 6, selector 13 outputs data Ra(x)#1 through Ra(x)#(w−2) which have been output by CRC computing unit 14 in the processing operation on the preceding word to CRC computing unit 14 after the second word has been input and until the (w−1)th word is input.

A process for CRC computing unit 14 to compute CRC value (integral multiple data block remainder) R(x) of integral multiple data block A(x) will be described below.

CRC computing unit 14 calculates a remainder produced when a polynomial of order (M−1) whose coefficients are represented by the bits of the data (word) having a width of M bits is divided by generator polynomial G(x) including order d. Order d of generator polynomial G(x) has been determined in advance.

Since the number of bits of integral multiple data block A(x) is an integral multiple of M (a multiple of (w−1) in the present exemplary embodiment), CRC computing unit 14 performs the above process of calculating the remainder with respect to the data of M bits, successively from first M bits a(x)#1 through final M bits a(x)#(w−1) of integral multiple data block A(x). When CRC computing unit 14 calculates remainder Ra(x)#1 with respect to first M bits a(x)#1, it outputs calculated remainder Ra(x)#1 to selector 13.

When next M bits a(x)#2 are input to CRC computing unit 14, CRC computing unit 14 shifts remainder Ra(x)#1 (d bits)

based on preceding word a(x)#1 toward the most significant bit by (M−d) bits. CRC computing unit 14 exclusive-ORs the shifted data and present input word M bits a(x)#2. Then, CRC computing unit 14 calculates remainder Ra(x)#2 produced when a polynomial produced by multiplying a polynomial of order (M−1) represented by the result of the exclusive-ORing operation by $x^d$ is divided by generator polynomial G(x).

CRC computing unit 14 repeats the same process with respect to subsequent data of M bits. Each of the bits of the data representative of the remainder corresponds to a coefficient of a polynomial of order (d−1), and shifting the remainder toward the most significant bit by (M−d) bits corresponds to multiplying a polynomial representing the remainder by $x^{M-d}$.

When final M bits a(x)#(w−1) are input to CRC computing unit 14, CRC computing unit 14 shifts remainder Ra(x)#(w−2) based on preceding word a(x)#(w−2) output from selector 13 toward the most significant bit by (M−d) bits. CRC computing unit 14 exclusive-ORs the shifted data and present input word M bits a(x)#(w−1). Then, CRC computing unit 14 calculates remainder Ra(x)#(w−1) produced when a polynomial produced by multiplying a polynomial of order (M−1) represented by the result of the exclusive-ORing operation by $x^d$ is divided by generator polynomial G(x). Calculated remainder Ra(x)#(w−1) represents CRC value Ra(x) of integral multiple data block A(x).

In this manner, CRC computing unit 14 performs CRC computations on integral multiple data block A(x) based on input frame a(x)#1 through a(x)#(w−1) output from shifter 12 and Ra(x)#1 through Ra(x)#(w−2) output from selector 13, and outputs CRC computational result Ra(x) as the wth word (a wth word sequence), as indicated by reference characters 6G in FIG. 6.

When control signal generator 11 receives final word valid data signal H(k) (H(k)>0), it sets the EOF signal to "H" level (the wth word indicated by reference characters 6L in FIG. 6), and outputs the EOF signal to selector 13. Furthermore, control signal generator 11 outputs shifting information p (p=M−H(k)) to shifter 12, as indicated by reference characters 6M in FIG. 6.

Shifter 12 is supplied with data b(x) of M bits including B(x) (the wth word indicated by reference characters 6D in FIG. 6). When shifter 12 receives input frame b(x) having a width of M bits, it shifts the data toward the least significant bit by shifting information p (p=M−H(k)) from control signal generator 11. Furthermore, shifter 12 sets the shifted p bits that are closer to the most significant bit (bits other than the bits of data b(x)) to "0" which does not affect CRC values. The shifter 12 now generates data b'(x) having a width of M bits (FIG. 7(B)), and outputs generated data b'(x) to CRC computing unit 14 (the wth word indicated by reference characters 6E in FIG. 6).

Figure 8:
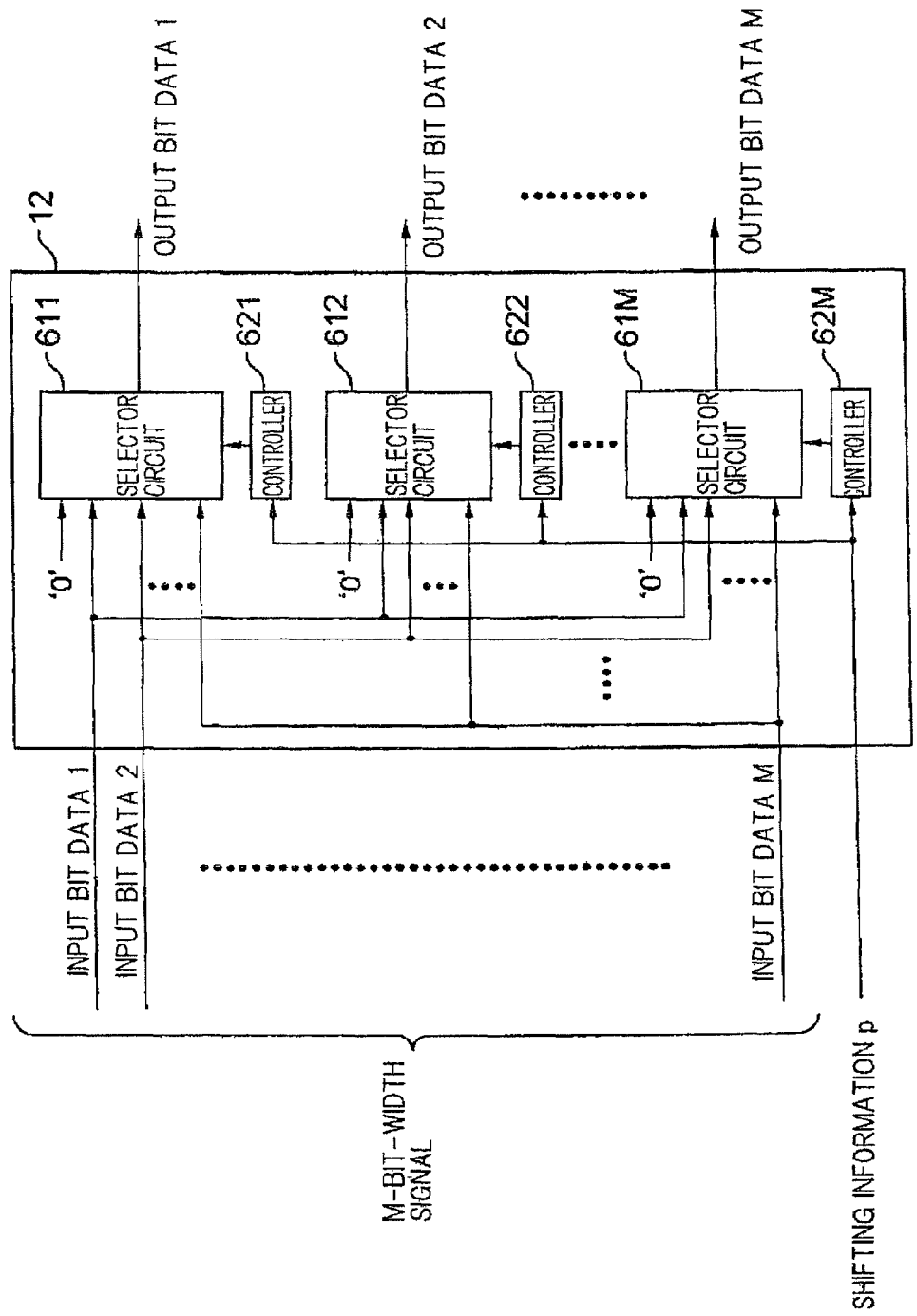
FIG. 8 is a block diagram of the shifter shown in FIG. 4.

Details of shifter 12 are shown in FIG. 8.

As shown in FIG. 8, shifter 12 comprises selector circuits 611 through 61M and controllers 621 through 62M. Selector circuits 611 through 61M are supplied with data of M bits and "0" of 1 bit. Depending on signals from controllers 621 through 62M, selector circuits 611 through 61M output one of the supplied bits.

Depending on shifting information p, controllers 621 through 62M generate signals for controlling selector circuits 611 through 61M, and output the generated signals.

A specific example of operation of shifter 12 will be described below.

If input bit width M=3, then shifter comprises selector circuits 611 through 613 and controllers 621 through 623.

It is assumed that the most significant bit on the input side is represented by input bit data 1, the least significant bit on the input side by input data 3, the most significant bit on the output side by output bit data 1, the least significant bit on the output side by output bit data, and shifting information p is equal to 1.

Based on shifting information p=1, controller 621 outputs a signal for outputting "0" to selector circuit 611. Based on the signal from controller 621, selector circuit 611 selects "0" and outputs it as output bit data 1.

Based on shifting information p=1, controller 622 outputs a signal for outputting input bit data "1" to selector circuit 612. Based on the signal from controller 622, selector circuit 612 selects input bit data "1" and outputs it as output bit data 2.

Based on shifting information p=1, controller 623 outputs a signal for outputting input bit data "2" to selector circuit 613. Based on the signal from controller 623, selector circuit 613 selects input bit data "2" and outputs it as output bit data 3.

In this manner, shifter 12 outputs "0" as output bit data 1, input data bit 1 as output bit data 2, and input data bit 2 as output bit data 3. In other words, when shifting information p=1, the input bit data are shifted toward the least significant bit by 1 bit.

It is assumed that shifting information p=2.

Based on shifting information p=2, controller 621 outputs a signal for outputting "0" to selector circuit 611. Based on the signal from controller 621, selector circuit 611 selects "0" and outputs it as output bit data 1.

Based on shifting information p=2, controller 622 outputs a signal for outputting "0" to selector circuit 612. Based on the signal from controller 622, selector circuit 612 selects "0" and outputs it as output bit data 2.

Based on shifting information p=2, controller 623 outputs a signal for outputting input bit data "1" to selector circuit 613. Based on the signal from controller 623, selector circuit 613 selects input bit data "1" and outputs it as output bit data 3.

In this manner, shifter 12 outputs "0" as output bit data 1, "0" as output bit data 2, and input data bit 1 as output bit data 3. In other words, when shifting information p=2, the input bit data are shifted toward the least significant bit by 2 bits.

The specific example of operation of shifter 12 wherein M=3 has been described above. Shifter 12 operates similarly when M has other values.

Based on the EOF signal from control signal generator 11, selector 13 outputs "0" data to CRC computing unit 14 (the wth word indicated by reference characters 6F in FIG. 6). CRC computing unit 14 carries out CRC computations for a width of M bits. Using the "0" data output from selector 13, CRC computing unit 14 performs CRC computations on B(x) included in data b'(x) output from shifter 12, and outputs computational result (final word valid data block remainder) Rb(x) (refer to the (w+1)th word indicated by reference characters 6B in FIG. 6).

Depending on number H(k) of final word valid bits output from control signal generator 11, coefficient unit 15 outputs coefficient $\beta_{H(k)}(x)$ corresponding to number H(k) of final word valid bits to multiplier 16 (the wth word indicated by reference characters 6H in FIG. 6).

Figure 9:
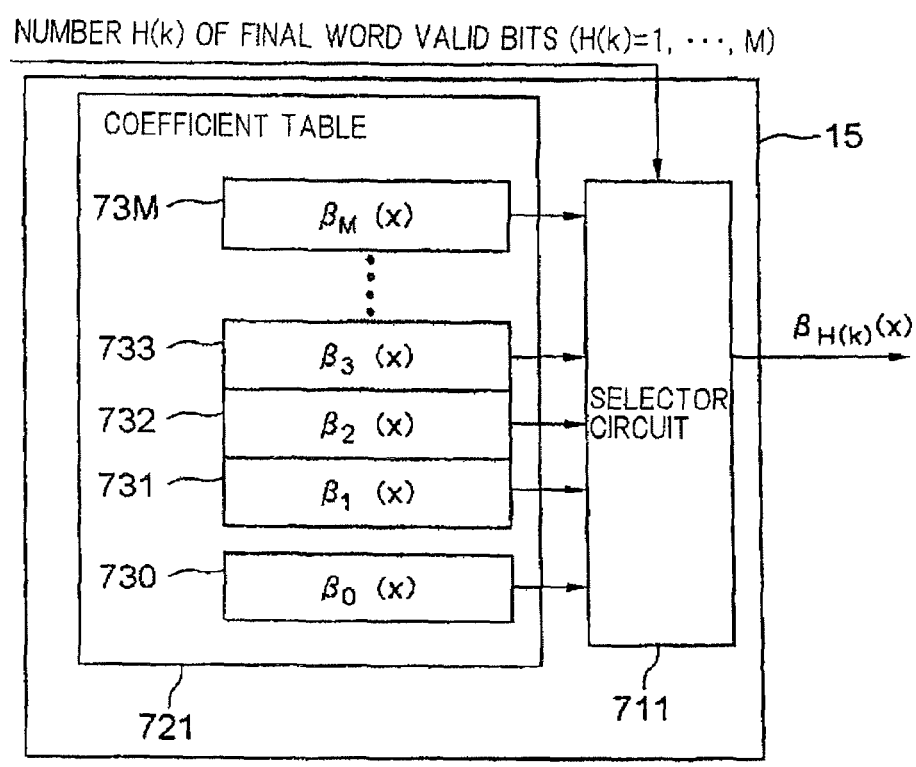
FIG. 9 is a block diagram of a coefficient storage shown in FIG. 4.

Details of coefficient unit 15 is shown in FIG. 9.

As shown in FIG. 9, coefficient unit 15 comprises selector circuit 711 and coefficient table 721. Coefficient table 721 stores in advance M coefficients $\beta 1(x)$ 731 through $\beta M(x)$ 73M calculated according to the above equation (7), A specific example of operation of coefficient unit 15 wherein M=3 will be described below.

Coefficient table 721 stores coefficients β1(1) 731 through β3(x) 733. When selector circuit 711 receives number H(k) of final word valid bits=1, it outputs coefficient β1(x). When selector circuit 711 receives number H(k) of final word valid bits=2, it outputs coefficient β2(x). When selector circuit 711 receives number H(k) of final word valid bits=3, it outputs coefficient β3(x).

The specific example of operation of coefficient unit 15 wherein M=3 has been described above. Coefficient unit 15 operates similarly when M has other values.

Multiplier 16 multiplies coefficient $β_{H(k)}(x)$ (the wth word indicated by reference characters 6H in FIG. 6) and Ra(x) output from CRC computing unit 14 (multiplies them in a Galois field), and outputs the result of the multiplication, i.e., product R'a(x), to adder 17 (refer to the (w+1)th word indicated by reference characters 6I(i) in FIG. 6). The result of the multiplication, i.e., product R'a(x), represents a remainder produced when a general polynomial which has been multiplied is divided by generator polynomial G(x).

An example of a multiplying circuit in a Galois field will be described below.

When 3-bit polynomials, i.e., $Ra(x)=(ra_2 \cdot x^2+ra_1 \cdot x^2+ra_0 \cdot x^0)$ and $β(x)=(bt_2 \cdot x^2+bt_1 \cdot x^1+bt_0 \cdot x^0)$, are multiplied, the product is represented by a polynomial of order 4 according to the following equation (16):

$$E(x) = Ra(x) \cdot β(x) \qquad (16)$$
$$= e_4 \cdot x^4 + e_3 \cdot x^3 + e_2 \cdot x^2 + e_1 \cdot x^1 + e_0 \cdot x^0$$

The coefficients of the equation (16) are indicated by the following equations (17) through (21) where "·" represents an ANDing operation and "+" represents an exclusive-ORing (XORing) operation:

$$e_4 = ra_2 \cdot bt_2 \qquad (17)$$

$$e_3 = ra_1 \cdot bt_2 + ra_2 \cdot bt_1 \qquad (18)$$

$$e_2 = ra_0 \cdot bt_2 + ra_1 \cdot bt_1 + ra_2 \cdot bt_0 \qquad (19)$$

$$e_1 = ra_0 \cdot bt_1 + ra_1 \cdot bt_0 \qquad (20)$$

$$e_0 = ra_0 \cdot bt_0 \qquad (21)$$

When E(x) is divided by generator polynomial G(x) indicated by the equation (22) shown below, the remainder is represented by polynomial R'a(x) of order 2 or lower as indicated by the equation (23) shown below. In other words, R'a(x) is represented by the product of Ra and β(x).

$$G(x)=x^3+x^1+x^0 \qquad (22)$$

$$R'a(x)=r'a_2 \cdot x^2+r'a_1 \cdot x^1+r'a_0 \cdot x^0 \qquad (23)$$

Since additions and subtractions are the same in a Galois field, the coefficients of the equation (23) are expressed as follows:

$$r'a_2=e_2+e_4 \qquad (24)$$

$$r'a_1=e_1+e_3+e_4 \qquad (25)$$

$$r'a_0=e_0+e_3 \qquad (26)$$

As described above, product R'a(x) in a Galois field can be obtained by multiplying two 3-bit polynomials Ra(x), β(x) and calculating remainder (E(x) mod G(x)) produced when result E(x) of the multiplication is divided.

Figure 10:
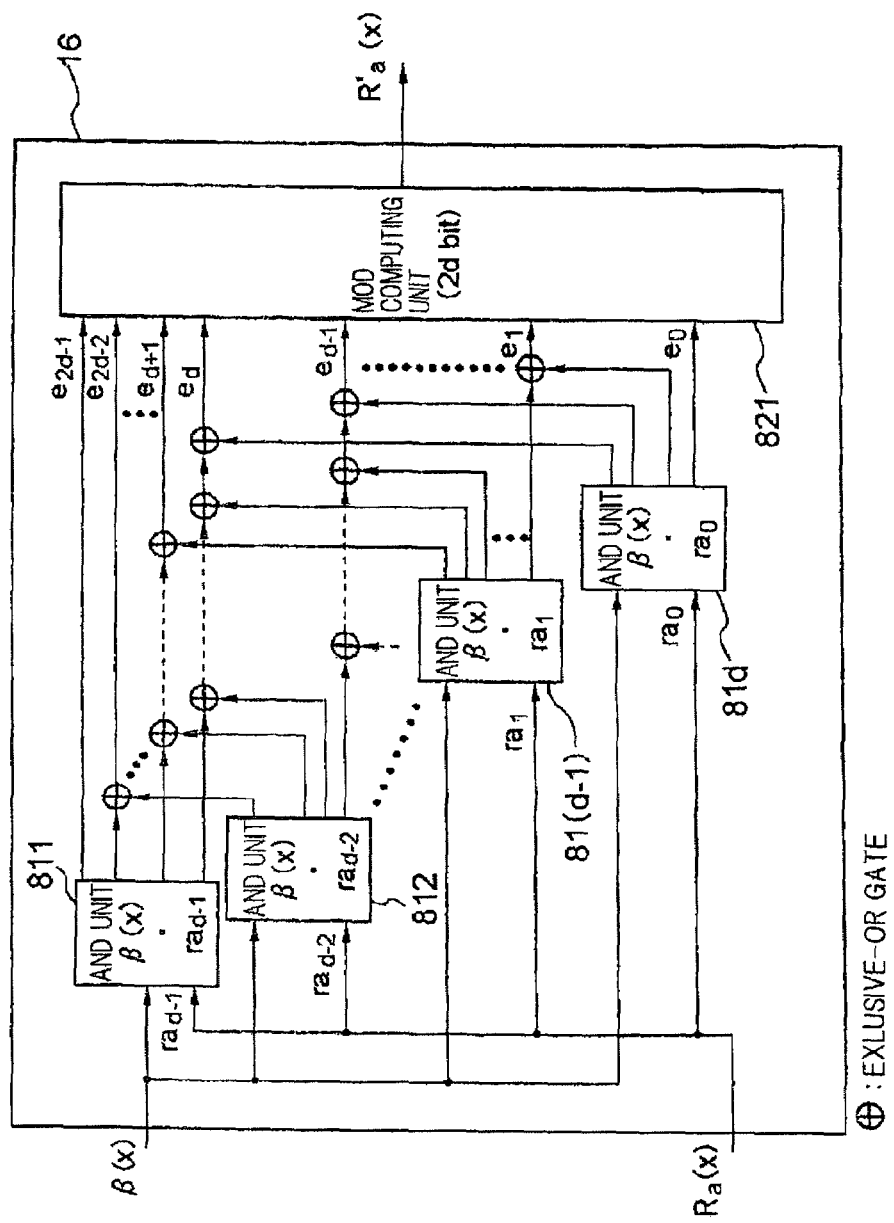
FIG. 10 is a block diagram of a multiplier shown in FIG. 4.

FIG. 10 shows a specific circuit example of multiplier 16.

As shown in FIG. 10, multiplier 16 comprises AND units 811 through 81d, mod computing unit 821 having an input width represented by as many bits as number 2d which is twice order d of generator polynomial G(x), and a plurality of exclusive-OR gates.

Figure 11:
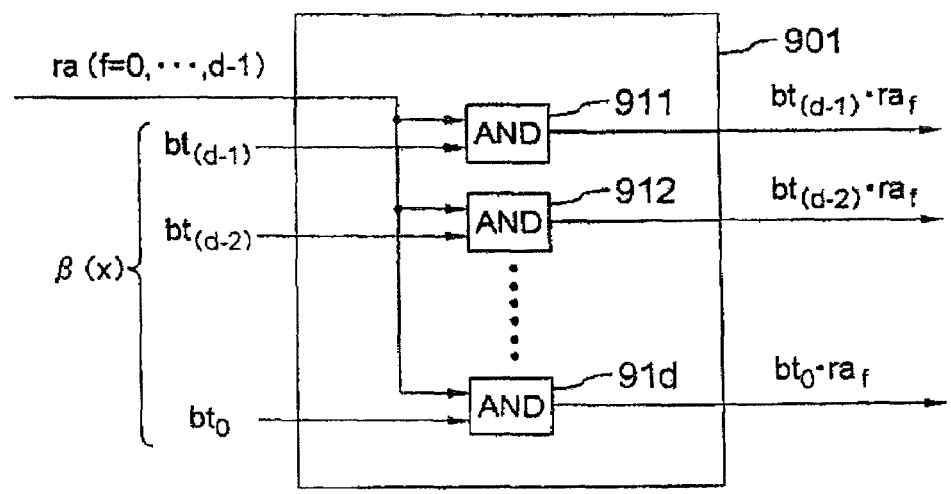
FIG. 11 is a block diagram of an AND assembly shown in FIG. 10.

AND units 811 through 81d AND signal β(x) output from coefficient unit 15 and Ra(x). FIG. 11 shows in detail AND unit 901 which is any one of AND units 811 through 81d.

As shown in FIG. 11, AND unit 901 comprises d AND gates 911 through 91d which are supplied with 1-bit signal raf (f represents an integer in the range $0 \leq f < d-1$). When raf=1, AND unit 901 outputs β(x), and when raf=0, AND unit 901 outputs "0" of d bits.

A specific example of operation of multiplier 16 will be described below. It is assumed in the specific example that d=3 and generator polynomial G(x) is represented by $G(x)=x^3+x^1+x^0$.

Input signal Ra(x) is represented by $Ra=(ra_2 \cdot x^2+ra_1 \cdot x^1+ra_0 \cdot x^0)$, and signal β(x) by $β(x)=(bt_2 \cdot x^2+bt_1 \cdot x^1+bt_0 \cdot x^0)$.

Multiplier 16 comprises three AND units 811 through 813 (since d=3, 81d becomes 813), and 6-bit-input (since d=3, 2d=6) mod computing unit 821. When Ra(x) and β(x) are input to multiplier 16, β(x) is supplied to AND units 811 through 813, $ra_2$ of Ra(x) is supplied to AND unit 811, $ra_1$ of Ra(x) is supplied to AND unit 812, and $ra_0$ of Ra(x) is supplied to AND unit 813. AND units 811 through 813 AND the input signals supplied thereto.

Specifically, AND unit 811 outputs $ra_2 \cdot bt_2$, $ra_2 \cdot bt_1$, and $ra_2 \cdot bt_0$ (raf=$ra_2$ in FIG. 11). AND unit 812 outputs $ra_1 \cdot bt_2$, $ra_1 \cdot bt_1$, and $ra_1 \cdot bt_0$ (raf=$ra_1$ in FIG. 11). AND unit 813 outputs $ra_0 \cdot bt_2$, $ra_0 \cdot bt_1$, and $ra_0 \cdot bt_0$ (raf=$ra_0$ in FIG. 11).

The exclusive-OR gates of multiplier 16 exclusive-OR the data output from AND units 811 through 813. Specifically, multiplier 16 calculates $ra_2 \cdot bt_2$ as $e_4$, exclusive-ORs $ra_1 \cdot bt_2$ and $ra_2 \cdot bt_1$ into $e_3$, exclusive-ORs $ra_0 \cdot bt_2$, $ra_1 \cdot bt_1$ and $ra_2 \cdot bt_0$ into $e_2$, exclusive-ORs $ra_0 \cdot bt_1$ and $ra_1 \cdot bt_0$ into $e_1$, and calculates $ra_0 \cdot bt_0$ as $e_0$.

Multiplier 16 inputs calculated $e_0$ through $e_4$ to mod computing unit 821, which exclusive-ORs $e_2$ and $e_4$ into $r'a_2$, exclusive-ORs $e_1$, $e_2$, and $e_4$ into $r'a_1$, and exclusive-ORs $e_0$ and $e_3$ into $r'a_0$. Then, mod computing unit 821 outputs product R'a(x) $(=r'a_2 \cdot x^2+r'a_1 \cdot x^1+r'a_0 \cdot x^0)$.

Adder 17 exclusive-ORs R'a(x) output from multiplier 16 (the (w+1)th word represented by reference characters 61 in FIG. 6) and Rb(x) output from CRC computing unit 14, and outputs CRC value (input data remainder) R(x) with respect to the input frame, together with the frame having the width of M bits, the SOF signal, and signal H(k) (the (w+2)th word represented by reference characters 6j in FIG. 6). These signals are supplied to FCS allocator 24. Input data remainder R(x) is used to perform an error detecting process on the data according to the cyclic redundancy check (CRC).

According to the first exemplary embodiment of the present invention as described above, the data of integral multiple data block A(x) are processed in parallel for each number M of parallel bits for thereby appropriately calculating integral multiple data block remainder Ra(x). As a result, input data remainder R(x) can be calculated with a low delay.

According to the first exemplary embodiment, furthermore, input data remainder R(x) can be calculated with a low delay without the need for a plurality of CRC computing units connected in cascade.

According to the first exemplary embodiment, furthermore, integral multiple data block remainder Ra(x) can appropriately be calculated by processing bits represented by the number M of parallel bits in parallel. Therefore, input data remainder R(x) can be calculated with a lower delay.

According to the first exemplary embodiment, moreover, one computing unit (CRC computing unit 14) for processing bits represented by the number M of parallel bits in parallel is used to calculate both final word valid data block remainder Rb(x) and integral multiple data block remainder Ra(x). As a consequence, the circuit scale is further reduced.

In the first exemplary embodiment, CRC computing unit 14 is arranged to process data wherein a bit corresponding to an term of the highest order of a polynomial is positioned at the most significant bit. However, CRC computing unit 14 may be arranged to process data wherein a bit corresponding to an term of the lowest degree of a polynomial is positioned at the most significant bit.

In the above case, shifter 12 may shift a signal having a width of M bits output from control signal generator 11 toward the most significant bit by shifting information p (p=M−H(k)), and set shifted p bits closer to the least significant bit to "0".

In the first exemplary embodiment, control signal generator 11 is arranged to generate an EOF signal as a frame final end signal and shifting information p from an SOF signal as a frame leading end signal and number H(k) of final word valid bits. However, control signal generator 11 may be arranged to generate an EOF signal and shifting information from other signals than an SOF signal and signal H(k), i.e., a bit enable signal for each group of input M bits.

In the first exemplary embodiment, if the input frame length is an integral multiple of the number M of parallel bits, then integral multiple data block remainder Ra(x) and final word valid data block remainder Rb(x) are independently calculated, and input data remainder R(x) is calculated based on calculated integral multiple data block remainder Ra(x) and final word valid data block remainder Rb(x). However, integral multiple data block remainder Ra(x) may be calculated as input data remainder R(x).

In the first exemplary embodiment, control signal generator 11 generates shifting information p for each bit, and shifter 12 shifts the data for each bit. However, control signal generator 11 may generate shifting information p for each group of bits (e.g., for each a byte), and shifter 12 may shift the data for each group of bits.

In addition, while the CRC (Cyclic Redundancy Check) code is used as the cyclic code in the first exemplary embodiment, other cyclic codes such as the Hamming code, the BCH code, etc. may also be used.

Parallel CRC code processor 23 may be implemented by a CPU which operates according to programs.

<2nd Exemplary Embodiment>

An Ethernet switch according to a second exemplary embodiment of the present invention will be described below.

Figure 12:
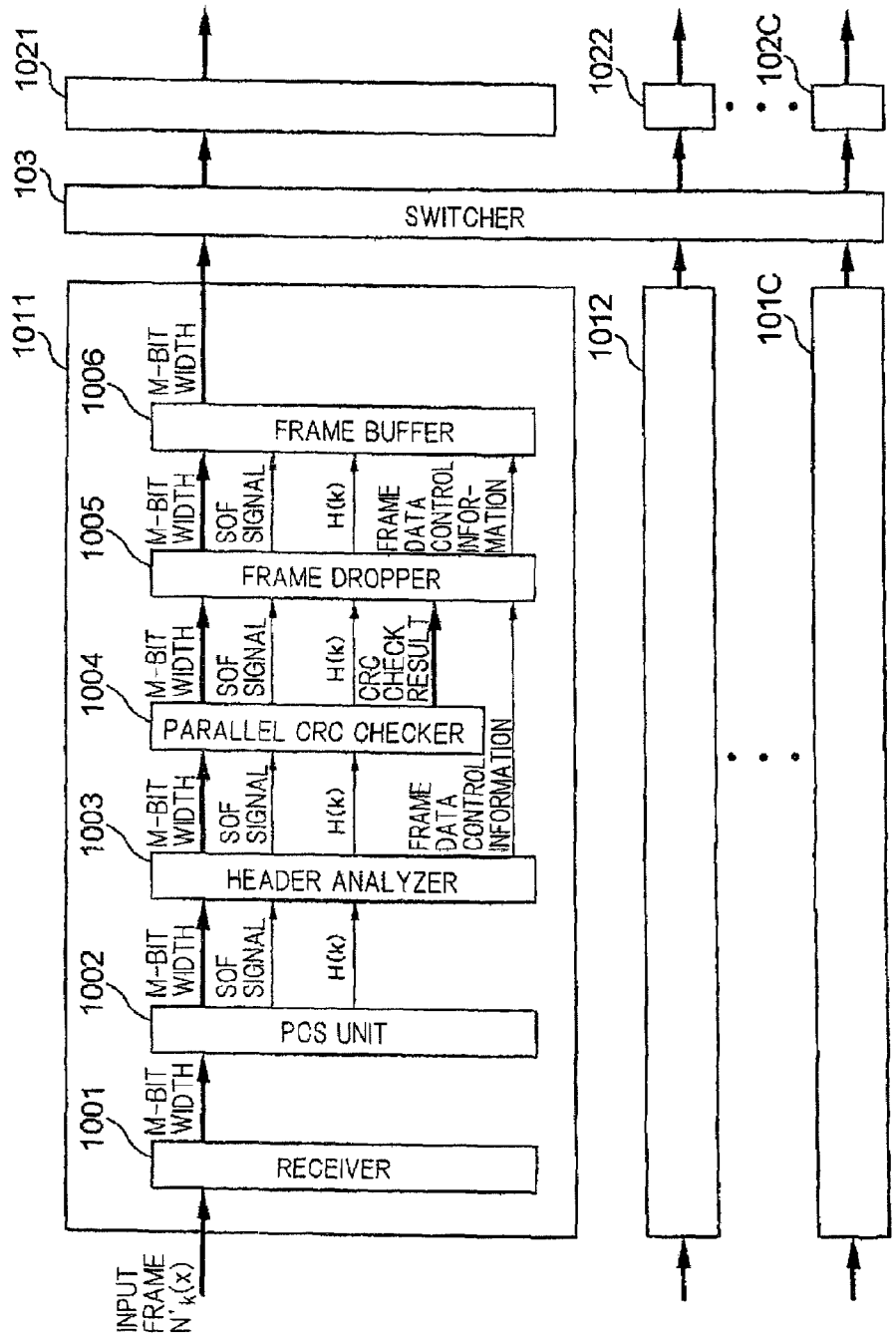
FIG. 12 is a block diagram of an Ethernet switch according to a second exemplary embodiment of the present invention.

As shown in FIG. 12, the Ethernet switch comprises line card receiver 1011 through 101C, switcher 103, and line card transmitters 1021 through 102C. The Ethernet switch includes C sets of line card receiver 1011 through 101C and line card transmitters 1021 through 102C where C represents an arbitrary positive integer of 1 or greater.

In FIG. 12, a single set of line card receiver 1011 through 101C and line card transmitters 1021 through 102C is mounted on a single line card having a single port. Line card receiver 1011 through 101C and line card transmitters 1021 through 102C are connected to switcher 103.

Line card receivers 1011 through 101C receive, analyze, check, and discard frames, and transfer frames which are transferable to switcher 103. Since line card receivers 1011 through 101C are identical to each other, an arrangement and operation of line card receiver 1011 will be described below.

Line card receiver 1011 comprises receiver 1001, PCS unit 1002, header analyzer 1003, parallel CRC checker 1004, frame dropper 1005, and frame buffer 1006.

Receiver 1001 is connected to PCS unit 1002. When receiver 1001 receives a frame (an input frame) from an external circuit, it converts the frame from serial data into parallel data, and outputs the converted frame to PCS unit 1002.

PCS unit 1002 has an input terminal connected to receiver 1001 and an output terminal connected to header analyzer 1003. PCS unit 1002 decodes the frame which has been encoded by a transmission channel encoding process such as an 8B/100B encoding process or a 64B/66B encoding process, and outputs the decoded frame which has a width of M bits to header analyzer 1003. If the Ethernet switch is in conformity with the 10-Gigabit Ethernet, then PCS unit 1002 decodes the frame according to a 64B/66B decoding process.

PCS unit 1002 generates an SOF signal indicative of the leading end of the frame and final word valid data signal H(k) indicative of the final end of the frame, and outputs these signals together with the frame having a width of M bits to header analyzer 1003. Specifically, PCS unit 1002 outputs an SOF signal to header analyzer 1003 when first M bits of the frame are output, and outputs the number of bits of final word valid data block B(x) (the number of final word valid bits) as final word valid data signal H(k) to header analyzer 1003 when final word valid data block B(x) at the tail end of the frame is output.

Header analyzer 1003 is connected to PCS unit 1002, parallel CRC checker 1004 and frame dropper 1005. Header analyzer 1003 analyzes the content of the header of a frame output from PCS unit 1002, and outputs frame control information based on the result of the analysis.

Header analyzer 1003 also outputs the frame to parallel CRC checker 1004. Specifically, header analyzer 1003 outputs an SOF signal when first M bits of the frame are output, and outputs final word valid data signal H(k) when final word valid data block B(x) at the tail end of the frame is output.

Parallel CRC checker 1004 is connected to header analyzer 1003 and frame dropper 1005. Parallel CRC checker 1004 performs CRC code computations on the header through FCS of the frame in order to detect an error in the input data frame. Parallel CRC checker 1004 then outputs the result of the CRC check as a result indicative of the result of the frame error detection to frame dropper 1005.

Frame dropper 1005 is connected to header analyzer 1003, parallel CRC checker 1004, and frame buffer 1006. Depending on the frame control information from header analyzer 1003 and the result of the CRC check from parallel CRC checker 1004, frame dropper 1005 drops a frame input from parallel CRC checker 1004. Frame dropper 1005 also outputs a frame for which the result of the CRC check is normal and its control information to frame buffer 1006.

Frame buffer 1006 is connected to frame dropper 1005 and switch 1003. Frame buffer 1006 buffers a frame that is to be output to switcher 103 and control information thereof.

Switcher 103 transfers the frame input from line card receiver 1011 to line card transmitter 1021 which is paired with line card receiver 1011 according to the frame control information. The frame control information indicates that the line card transmitter to which the frame is to be transferred is line card transmitter 1021. Alternatively, the frame control information may indicate that the line card transmitter to which the frame is to be transferred is a line card transmitter other than line card transmitter 1021.

Line card transmitter 1021 converts the frame transferred from switcher 103 from parallel data into serial data and transmits the converted frame. The other line card transmitters also operate in the same manner as line card transmitter 1021.

In the present exemplary embodiment, the parallel cyclic code processing circuit according to the present invention is applied to parallel CRC checker 1004 shown in FIG. 12.

Details of parallel CRC checker 1004 in line card receiver 1011 will be described below with reference to FIG. 13.

As with parallel CRC code processor 23 described above, parallel CRC checker 1004 receives a frame per word that comprises bits represented by the number M of parallel bits (an input frame including an FCS value). Parallel CRC checker 1004 perform CRC code computations on the leading end through FCS value of input frame $N'_k(x)$ (k represents an arbitrary positive integer of 1 or greater) in order to detect an error contained in the leading end through FCS value of input frame $N'_k(x)$. If number n of bits of input frame $N'_k(x)$ that is to be subjected to CRC code computations is not an integral multiple of the number M of parallel bits, i.e., if the final word valid data block includes fractional bits, then parallel CRC checker 1004 independently calculates CRC value (integral multiple data block remainder) $Ra(x)$ of integral multiple data block $A(x)$ which comprises bits other than a final word valid data block of the input frame $N'_k(x)$ (as many bits as an integral multiple of the number M of parallel bits), and CRC value (final word valid data block remainder) $Rb(x)$ of final word valid data block $B(x)$ made up of bits represented by number $H(k)$ of final word valid bits.

At this time, parallel CRC checker 1004 calculates CRC value $Ra(x)$ with a CRC computing unit having a width of M bits. Furthermore, parallel CRC checker 1004 generates data (signal) $b'(x)$ having a width of M bits wherein final word valid data block $B(x)$ is shifted toward the least significant bit by p ($p=M-H(k)$) bits and all bits that are closer to the most significant bit than the shifted data are set to "0", and inputs generated data $b'(x)$ to the CRC computing unit having the width of M bits to enable the latter to calculate CRC computational result $Rb(x)$.

Then, parallel CRC checker 1004 multiplies CRC computational result $Ra(x)$ and coefficient (remainder computing coefficient) $\beta_{H(k)}(x)$ corresponding to number $H(k)$ of final word valid bits (multiplies them in a Galois field), and adds the result of the multiplication, i.e., product $R'a(x)$, and CRC computational result $Rb(x)$ (adds them in a Galois field, i.e., exclusive-ORs them). According to the above process, a parallel CRC code processing operation can be carried out without the need for an increase in the number of CRC computing units. The above process is performed in accordance with the sequence based on the equation (15).

Figure 13:
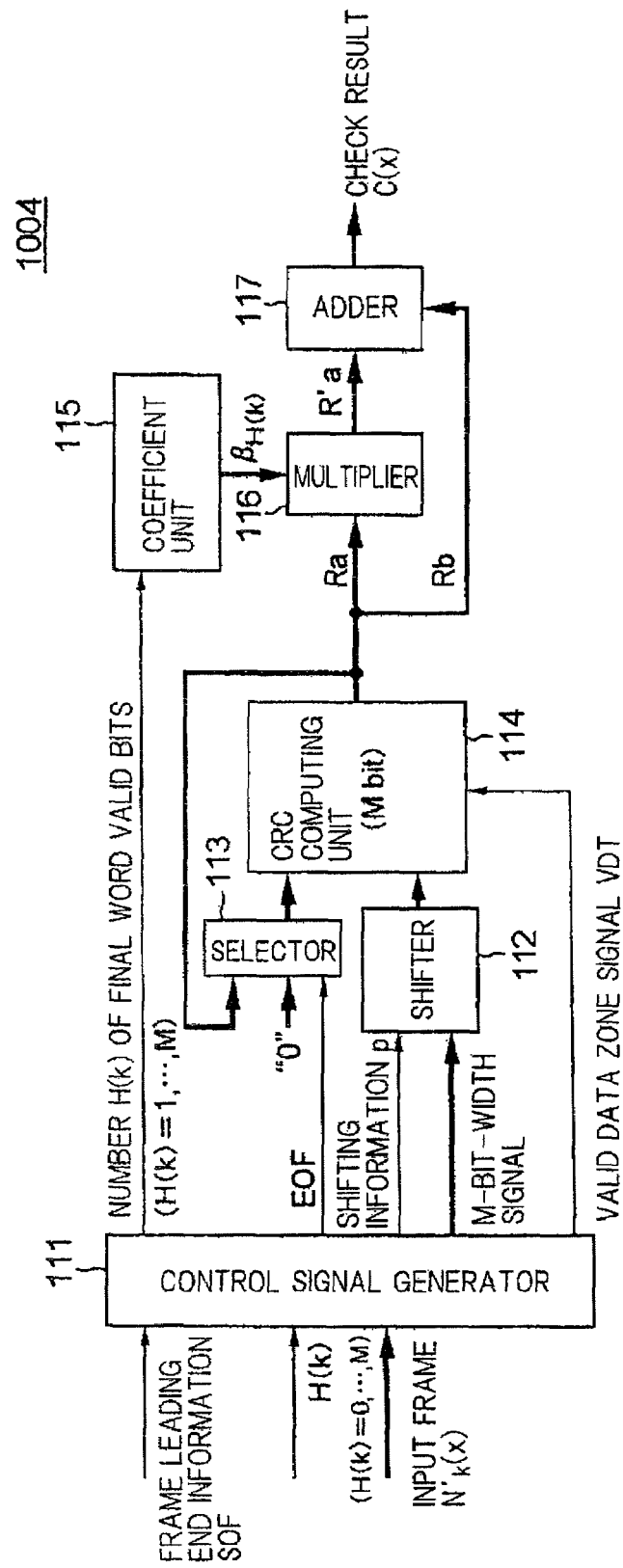
FIG. 13 is a block diagram of a parallel CRC checker shown in FIG. 12.

As shown in FIG. 13, parallel CRC checker 1004 comprises control signal generator (control signal generating unit) 111, shifter (shifting unit) 112, selector (selecting unit) 113, CRC computing unit (computing unit) 114, coefficient unit 115, multiplier 116, and adder 117.

Control signal generator 111, shifter 112, selector 113, and CRC computing unit 114 make up an integral multiple data block remainder computing unit (an integral multiple data block remainder computing step) and a final word valid data block remainder computing unit (a final word valid data block remainder computing step). Coefficient unit 115, multiplier 116, and adder 117 jointly make up an input data remainder computing unit (an input data remainder computing step).

Control signal generator 111 outputs input frame (input data) $N'_k(x)$ per word comprising bits represented by the number M of parallel bits successively from the leading bit. Control signal generator 111 generates an EOF signal, shifting information, and valid data zone signal VDT, which serve as a control signal, from an SOF signal and number $H(k)$ of fractional bits.

If the data to be output represent a final word of the frame data ($H(k)\neq 0$), then control signal generator 111 generates an EOF signal indicative of the final end (tail end) of the frame, and outputs the generated EOF signal to selector 113. Control signal generator 11 generates shifting information p ($p=M-H(k)$) by subtracting $H(k)$ from the number M of parallel bits, and outputs generated shifting information p to shifter 112. Furthermore, control signal generator 111 outputs signal $H(k)$ to coefficient unit 115. Since the value of $H(k)$ output to coefficient unit 115 is a value at the EOF position of the frame, it ranges from 1 through M.

If the input frame length is an integral multiple of the number M of parallel bits, then control signal generator 111 receives final word valid data signal $H(k)=M$. When control signal generator 111 receives final word valid data signal $H(k)=M$, control signal generator 111 generates an EOF signal indicative of the final end (tail end) of the frame, and outputs the generated EOF signal to selector 113. Moreover, control signal generator 111 generates shifting information $p=0$ ($p=M-H(k)$) by subtracting $H(k)$ from the number M of parallel bits, and outputs generated shifting information p to shifter 112. Furthermore, control signal generator 111 outputs received signal $H(k)=M$ to coefficient unit 115.

While outputting data including at least a portion of the input data, control signal generator 111 generates valid data zone signal VDT and outputs generated valid data zone signal VDT to CRC computing unit 114.

When shifting information p that is output from control signal generator 111 is input to shifter 112, shifter 112 shifts the data having a width of M bits that is output from control signal generator 111 toward the least significant bit by shifting information p ($p=M-H(k)$) that is output from control signal generator 111. Furthermore, shifter 112 sets "0" in p bits that are closer to the most significant bit and which are generated by the shifting process (bits other the data output from control signal generator 111).

Therefore, data to be computed by CRC computing unit 114 represent (a polynomial having coefficients represented by the bits of) final word valid data block $B(x)$ which comprises bits represented by length $H(k)$. Therefore, a CRC computational result that is representative of final word valid data block $B(x)$ which comprises bits represented by number $H(k)$ of final word valid bits can be processed by CRC computing unit 114 which is supplied with M bits.

When the EOF signal is input from control signal generator 111 to selector 113, selector 113 outputs data ("0" data) comprising as many "0"s as order d of generator polynomial $G(x)$ to CRC computing unit 114. If no EOF signal is input from control signal generator 111 to selector 113, then selector 113 outputs the CRC value in the preceding cycle from CRC computing unit 114 (the CRC value output from the preceding processing process) to CRC computing unit 114.

CRC computing unit 114 processes the bits represented by the number M of parallel bits in parallel based on the CRC value having a width of d bits in the preceding cycle (or "0" data) which is output from selector 113 and the data having a width of M bits which is output from shifter 112, and outputs data representative of the result of the computations (computational result). Specifically, CRC computing unit 114 adds data produced when the data output from selector 113 is multiplied by $x^{M-d}$ and the data output from shifter 112, and calculates a remainder produced when the sum is divided by generator polynomial G(x), as a computational result.

Coefficient unit 115 stores in advance M coefficients $\beta_{H(k)}$(x) (H(k)=1 through M) calculated according to the above equation (7). When signal H(k) output from control signal generator 111 is input to coefficient unit 115, coefficient unit 115 outputs coefficient $\beta_{H(k)}$(x) depending on signal H(k).

Multiplier 116 multiplies coefficient $\beta_{H(k)}$(x) output from coefficient unit 115 and CRC value Ra(x) of integral multiple data block A(x) output from CRC computing unit 114 (multiplies them in a Galois field), and outputs the result of the multiplication, i.e., product R'a(x), to adder 117.

Adder 117 adds output R'a(x) from multiplier 116 and CRC value Rb(x) of final word valid data block B(x) (adds them in a Galois field, i.e., exclusive-ORs them).

As described above, if CRC-32 is applied to CRC computing unit 114, then a circuit which is an M-bit-width version of the CRC computing circuit for serial data shown in FIG. 4 of JP-A No. 2002-359561 is used as the CRC computing unit. The CRC computing unit thus used covers the header through FCS of the frame for CRC computations, and produces a CRC computational result (the output of adder 117) "0" when the frame contains no error, and produces a CRC computational result other than "0" when the frame contains an error.

Operation of the Ethernet switch shown in FIG. 12 and parallel CRC checker 1004 (parallel CRC code processing circuit) shown in FIG. 13 will be described below.

Figure 14:
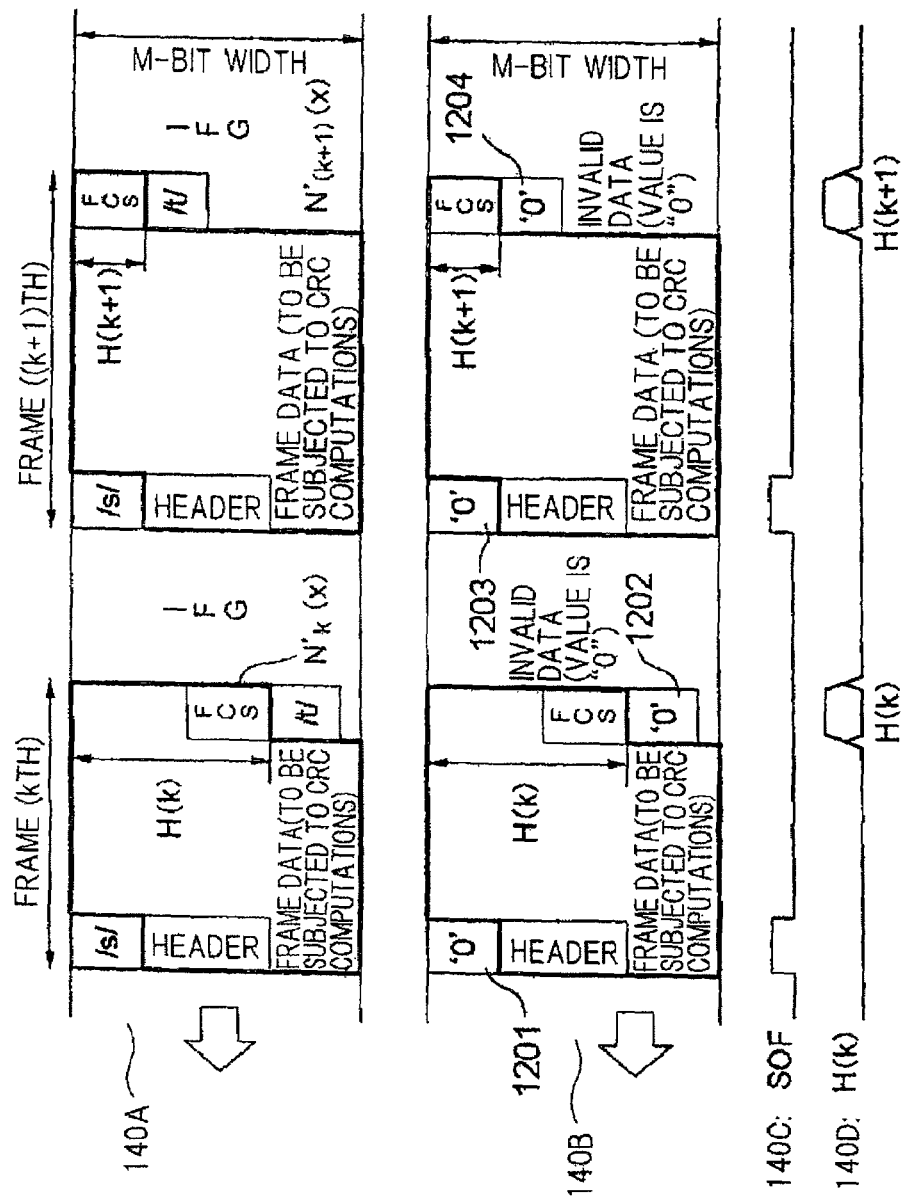
FIG. 14 is a timing chart of input signals and output signals of the parallel CRC checker and a PCS unit shown in FIG. 12.
Figure 16A:
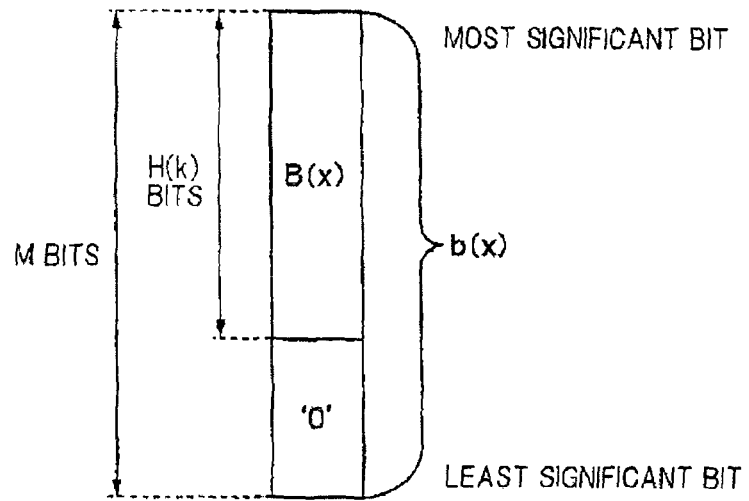
FIG. 16A is a diagram showing a shifting process performed by a shifter shown in FIG. 13.
Figure 16B:
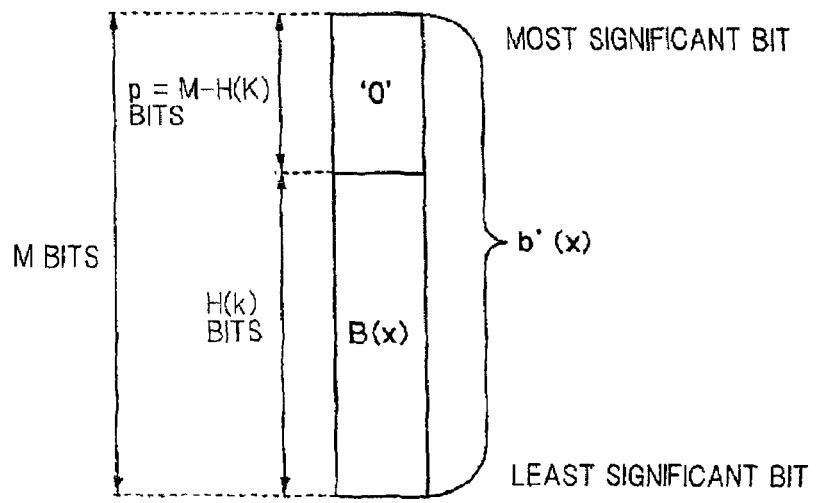
FIG. 16B is a diagram showing a shifting process performed by a shifter shown in FIG. 13.

FIG. 14 is a timing chart of frames that are input to PCS unit 1002 and frames and signals that are output from PCS unit 1002.

In FIG. 14, reference characters 140A represent frames that are input to PCS unit 1002, reference characters 140B through 140D frames, an SOF signal, and signal H(k) that is output from PCS unit 1002 to header analyzer 1003.

When receiver 1001 (see FIG. 12) receives a frame, it converts the frame from serial data into parallel data, and outputs the converted frame to PCS unit 1002. This frame is indicated by reference characters 140A in FIG. 14.

PCS unit 1002 decodes the frame input from receiver 1001. PCS unit 1002 then generates an SOF signal indicative of the leading end of the frame and final word valid data signal H(k) that is indicative of the final end of the frame, and output these signals together with the frame having a width of M bits to header analyzer 1003 (see reference characters 140B through 140D in FIG. 14). Specifically, PCS unit 1002 outputs an SOF signal to header analyzer 1003 when first M bits of the frame are output, and outputs the number of bits of final word valid data block B(x) to header analyzer 1003 when final word valid data block B(x) at the tail end of the frame is output.

The frame input to PCS unit 1002 includes "/S/" (Start) at the leading end of the header, "/TP/" (Terminate) at the final end (tail end) of the frame, with IFG (Inter-Frame Gap, a gap between frames) being provided between adjacent frames.

PCS unit 1002 outputs a signal wherein "/S/" (Start), "/T/" (Terminate), and IFG are replaced with "0" to header analyzer 1003. As a result, as indicated by reference characters 140B in FIG. 14, frame start delimiters 1201, 1203, frame end delimiters 1202, 1204, and IFG represent invalid data.

Header analyzer 1003 analyzes the header of a frame, generates frame control information, and outputs the frame control information to frame dropper 1005. Header analyzer 1003 also outputs the frame, the SOF signal, and signal H(k) output from PCS unit 1002 to parallel CRC checker 1004. Specifically, header analyzer 1003 outputs an SOF signal when first M bits of the frame are output, and outputs final word valid data signal H(k) when final word valid data block B(x) at the tail end of the frame is output.

Depending on the SOF signal and signal H(k) input from header analyzer 1003, parallel CRC checker 1004 calculates a CRC value from the header through FCS of the input frame (the frame to be checked). Parallel CRC checker 1004 outputs the calculated CRC value as a CRC check result to frame dropper 1005.

Frame dropper 1005 drops a frame according to the frame control information output from header analyzer 1003 and the CRC check the result that is output from parallel CRC checker 1004. Frame dropper 1005 also outputs a frame for which the CRC check result is normal, together with the frame control information, to frame buffer 1006.

Frame buffer 1006 buffers a frame input from frame dropper 1005 and its control information. After having buffered the frame and the control information, frame buffer 1006 outputs the frame and the control information to switcher 103.

According to the frame control information, switcher 103 transfers the frame output from frame buffer 1006 to a line card transmitter. Specifically, switcher 103 transfers the frame to line card transmitter 1021 which is paired with line card receiver 1011 that has output the frame to switcher 103. Consequently, the frame control information indicates that the line card transmitter to which the frame is to be transferred is line card transmitter 1021. Alternatively, the frame control information may indicate that the line card transmitter to which the frame is to be transferred is a line card transmitter other than line card transmitter 1021.

Line card transmitter 1021 converts the frame transferred from switcher 103 from parallel data into serial data.

Details of operation of parallel CRC checker 1004 will be described below.

FIG. 15 is a timing chart of inputs and outputs of various components of parallel CRC checker 1004.

In FIG. 15, reference characters 150A through 150C indicate an SOF signal, signal H(k), and a frame, respectively, which are input to control signal generator 111, and reference characters 150D indicates words (sequences) of the frame input to control signal generator 111. Each of the words comprises M bits. Reference characters 150E through 150J indicate respective outputs from shifter 112, selector 113, CRC computing unit 114, coefficient unit 115, multiplier 116, and adder 117, and reference characters 150K through 150M signal VDT, an EOM signal, and shifting information p, respectively.

As indicated by reference characters 150A through 150D in FIG. 15, the input frame having the width of M bits which is to be subjected to a CRC check, the SOF signal that is indicative of the leading end of the frame, and final word valid data signal H(k) that is indicative of the tail end of the frame are input from header analyzer 1003 to control signal generator 111. Final word valid data signal H(k) is a signal indicative of the number of bits of final word valid data block B(x) (the number of final word valid bits). Unlike input frame $N_k(x)$ supplied to parallel CRC code processor 23 of MAC transmission processor 27 according to the first exemplary embodiment, input frame $N'_k(x)$ supplied to parallel CRC checker 1004 according to the present exemplary embodiment includes an FCS therein (see reference characters 150C in FIG. 15).

Reference characters 150D in FIG. 15 schematically show words of the input frame (each word comprises bits represented by the number M of parallel bits). First word a(x)#1 through (w−1)th word a(x)#(w−1) make up integral multiple data block A(x). wth word b(x) makes up final word valid data block B(x).

Reference characters 150K through 150M in FIG. 15 indicate signals generated by control signal generator 111. Reference characters 150K in FIG. 15 indicate valid data zone signal VDT whose "H" level represents "valid" and whose "L" level represents "invalid. Reference characters 150L in FIG. 15 indicate an EOF signal whose "H" level represents the final word (the wth word) of the frame and whose "L" level does not represent the final word (the wth word) of the frame.

As indicated by reference characters 150A through 150D in FIG. 15, when the frame and the signals (SOF, H(k)) are input to control signal generator 111, control signal generator 111 sets valid data zone signal VDT to a signal indicative of "valid) after the SOF signal has been input and until signal H(k)) is input, and outputs valid data zone signal VDT to CRC computing unit 114 (see reference characters 150K in FIG. 15).

After the SOF signal has been input and until signal H(k)) is input, control signal generator 111 sets the EOF signal to a signal indicative of "L: Low", and outputs the EOF signal thus set to selector 113.

Depending on shifting information p from control signal generator 111, shifter 112 shifts the input frame having a width of M bits (see reference characters 150D in FIG. 15).

The first word through (w−1)th words of the input frame having the width of M bits (see reference characters 150D in FIG. 15) do not include final word valid data block B(x). Therefore, shifter 112 does not shift those words, but outputs first word a(x)#1 through (w−1)th word a(x)#(w−1) successively to CRC computing unit 114.

Depending on the EOF signal that is indicated by reference characters 150L in FIG. 15, selector 113 outputs data Ra(x)#1 through Ra(x)#(w−1) which have been output from CRC computing unit 114 in the processing operation on the preceding word to CRC computing unit 114, during an interval from the second word until the (w−1)th word, as indicated by reference characters 150F in FIG. 15.

CRC computing unit 114 performs CRC computations on integral multiple data block A(x) based on input frame a(x)#1 through a(x)#(w−1) output from shifter 112 and Ra(x)#1 through Ra(x)#(w−2) output from selector 113, and outputs CRC computational result (integral multiple data block remainder) Ra(x) as the wth word, as indicated by reference characters 150G in FIG. 15.

When control signal generator 111 receives final word valid data signal H(k) (H(k)>0), it sets the EOF signal to "H" level (the wth word indicated by reference characters 1501 in FIG. 15), and outputs the EOF signal to selector 113. Furthermore, control signal generator 111 outputs shifting information p (p=M−H(k)) to shifter 112, as indicated by reference characters 150M in FIG. 15.

Shifter 112 is supplied with data b(x) of M bits including B(x) (the wth word indicated by reference characters 150D in FIG. 15). When shifter 112 receives input frame b(x) having a width of M bits, it shifts the data toward the least significant bit by shifting information p (p=M−H(k)) from control signal generator 111. Furthermore, shifter 112 sets the shifted p bits closer to the most significant bit (bits that are closer to the most significant bit than shifted data b(x)) to "0" which does not affect CRC values. The shifter 112 now generates data b'(x) having a width of M bits (FIG. 16(B)), and outputs generated data b'(x) to CRC computing unit 114 (the wth word indicated by reference characters 150E in FIG. 15).

Shifter 112 is identical in arrangement and operation to shifter 12 according to the first exemplary embodiment.

Depending on the EOF signal from control signal generator 111, selector 113 outputs "0" data to CRC computing unit 114 (the wth word indicated by reference characters 150F in FIG. 15).

CRC computing unit 114 performs CRC computations having a width of M bits. Specifically, CRC computing unit 114 performs CRC computations on B(x) included in output data b'(x) output from shifter 112, using the "0" data output from selector 113, and outputs CRC value (final word valid data block remainder) Rb(x) (the (w+1)th word indicated by reference characters 150G in FIG. 15).

Depending on number H(k)) of final word valid bits output from control signal generator 111, coefficient unit 115 outputs coefficient (remainder computing coefficient) $\beta_{H(k)}(x)$ corresponding to number H(k) of final word valid bits to multiplier 116 (the wth word indicated by reference characters 150H in FIG. 15).

Coefficient unit 115 is identical in arrangement and operation to coefficient unit 15 according to the first exemplary embodiment.

Multiplier 116 multiplies coefficient $\beta_{H(k)}(x)$ (the wth word indicated by reference characters 150H in FIG. 15) output from coefficient unit 115 and CRC value Ra(x) output from CRC computing unit 114 (multiplies them in a Galois field), and outputs the result of the multiplication, i.e., product R'a(x), to adder 117 (the (w+1)th word indicated by reference characters 1501 in FIG. 15).

Multiplier 116 is identical in arrangement and operation to multiplier 16 according to the first exemplary embodiment.

Adder 117 exclusive-ORs R'a(x) output from multiplier 116 (the (w+1)th word represented by reference characters 1501 in FIG. 15) and Rb(x) output from CRC computing unit 114, and outputs CRC check result (input data remainder) C(x) with respect to the input frame, together with the frame having the width of M bits, the SOF signal, and signal H(k) (the (w+2)th word represented by reference characters 150j in FIG. 15). These signals are output to frame dropper 1005.

According to the second exemplary embodiment of the present invention as described above, the data of integral multiple data block A(x) are processed in parallel for each number M of parallel bits for thereby appropriately calculating integral multiple data block remainder Ra(x). As a result, input data remainder R(x) can be calculated with a low delay.

According to the second exemplary embodiment, furthermore, final word valid data block remainder Rb(x) can appropriately be calculated without the need for a plurality of CRC computing units having different numbers M of parallel bits. In other words, the CRC code processing circuit can be reduced in scale.

According to the second exemplary embodiment, furthermore, input data remainder R(x) can be calculated with a low delay without the need for a plurality of CRC computing units connected in cascade.

According to the second exemplary embodiment, furthermore, final word valid data block remainder Rb(x) can appropriately be calculated by processing bits represented by the number M of parallel bits in parallel. Therefore, input data remainder R(x) can be calculated with a lower delay.

According to the second exemplary embodiment, moreover, one computing unit (CRC computing unit 114) for processing bits represented by the number M of parallel bits in parallel is used to calculate both final word valid data block remainder Rb(x) and integral multiple data block remainder Ra(x). As a consequence, the circuit scale is further reduced.

In the second exemplary embodiment, CRC computing unit 114 is arranged to process data wherein a bit corresponding to a term of the highest order of a polynomial is positioned at the most significant bit. However, CRC computing unit 114 may be arranged to process data wherein a bit corresponding to a term of the lowest degree of a polynomial is positioned at the most significant bit. In this case, shifter 112 may shift a signal having a width of M bits output from control signal generator 111 toward the most significant bit by shifting information p (p=M−H(k)), and may set all shifted bits (p bits) closer to the least significant bit to "0".

In the second exemplary embodiment, control signal generator 111 is arranged to generate an EOF signal as a frame final end signal and shifting information p from an SOF signal as a frame leading end signal and number H(k) of final word valid bits. However, control signal generator 111 may be arranged to generate an EOF signal and shifting information from signals other than an SOF signal and signal H(k)), i.e., a bit enable signal for each group of input M bits.

In the second exemplary embodiment, control signal generator 111 generates shifting information p for each bit, and shifter 112 shifts the data for each bit. However, control signal generator 111 may generate shifting information p for each group of bits (e.g., for each a byte), and shifter 112 may shift the data for each group of bits.

In the second exemplary embodiment, if the input frame length is an integral multiple of the number M of parallel bits, then integral multiple data block remainder Ra(x) and final word valid data block remainder Rb(x) are independently calculated, and input data remainder R(x) is calculated based on calculated integral multiple data block remainder Ra(x) and final word valid data block remainder Rb(x). However, integral multiple data block remainder Ra(x) may be calculated as input data remainder R(x).

In addition, while the CRC (Cyclic Redundancy Check) code is used as the cyclic code in the second exemplary embodiment, other cyclic codes such as the Hamming code, the BCH code, etc. may also be used.

Parallel CRC checker 1004 may be implemented by a CPU which operates according to programs.

Furthermore, parallel CRC checker 1004 may be used as a CRC checker circuit in the receiving side of a network interface card.

Parallel CRC code processor 23 according to the first exemplary embodiment may be used as a CRC generating circuit provided in each of line card transmitters 1021 through 102C.

The present invention is not limited to each of the exemplary embodiments described above, but various modifications may be made within the scope of the invention.

Each of the exemplary embodiments described above may be regarded as using a CRC code processing process for dividing data series Hk(x) of an arbitrary length by arbitrary generator polynomial G(x) with arbitrary parallelism M (M represents a positive integer of 2 or greater) to calculate a remainder, comprising:

dividing said data series Hk(x) into integral multiple data block A(x) having a length which is an integral multiple of M and final word valid data block B(x) having length M−p (p represents a positive integer which is not smaller than 0 but is less than M−1), exclusive of final word valid data block B(x);

dividing said integral multiple data block A(x) by the generator polynomial G(x);

dividing said final word valid data block B(x) by the generator polynomial G(x);

b multiplying a remainder produced when said integral multiple data block A(x) is divided by the generator polynomial G(x), by a coefficient to produce a product; and exclusive-ORing the product and a remainder produced when said final word valid data block B(x) is divided by the generator polynomial G(x) thereby to calculate a remainder produced when data series Hk(x) is divided by the generator polynomial G(x).

Each of the exemplary embodiments described above may also be regarded as using a CRC code processing circuit for dividing data series Hk(x) of an arbitrary length by arbitrary generator polynomial G(x) of order d ith arbitrary parallelism M (M represents a positive integer of 2 or greater) to calculate a remainder, comprising:

means for dividing said data series Hk(x) into integral multiple data block A(x) having a length which is an integral multiple of M and final word valid data block B(x) having length M−p (p represents a positive integer which is not smaller than 0 but is less than M−1), exclusive of final word valid data block B(x);

means for shifting said final word valid data block B(x) toward low-order bits and adding "0" of p bits to high-order bits to generate a data block having a width of M bits;

means for calculating a remainder with respect to the shifted data having the width of M bits and said integral multiple data block A(x);

means for multiplying the remainder with respect to said integral multiple data block A(x) and coefficients corresponding to M−p bits; and means for exclusive-ORing a product having a width of d bits and the remainder calculated with respect to said final word valid data block B(x) which has the width of d bits.

The second exemplary embodiment may be regarded as using a CRC code check processing circuit for dividing data series Hk(x) of an arbitrary length including a checking CRC code by arbitrary generator polynomial G(x) of order d with arbitrary parallelism M (M represents a positive integer of 2 or greater) to detect an error of data series Nk(x), comprising:

means for dividing the data series Hk(x) of the arbitrary length including the checking CRC code into integral multiple data block A(x) having a length which is an integral multiple of M and final word valid data block B(x) having a width of M−p bits (p represents a positive integer which is not smaller than 0 but is less than M−1), exclusive of final word valid data block B(x);

means for shifting said final word valid data block B(x) toward low-order bits and adding "0" of p bits to high-order bits to generate a data block having a width of M bits;

means for performing CRC computations with respect to the shifted data having the width of M bits and said integral multiple data block A(x);

means for multiplying a CRC computational result from said integral multiple data block A(x) by coefficients corresponding to M−p bits; and means for exclusive-ORing a product having a width of d bits and the a CRC computational result from said final word valid data block B(x) which has the width of d bits.

With the present invention arranged as described above, the circuit scale is prevented from being excessively large and the processing delay is prevented from being excessively large even if the parallel width of input data is large.

The present invention is applicable to communication apparatuses that employ cyclic codes, etc.

While the invention has been particularly shown and described with reference to exemplary embodiments thereof, the invention is not limited to these embodiments. It will be understood by those of ordinary skill in the art that various changes in form and details may be made therein without departing from the spirit and scope of the invention as defined by the claims.

What is claimed is:

1. A cyclic code processing circuit which calculates an input data remainder which is a remainder produced when input data are divided by a generator polynomial, said input data comprising a plurality of successive bits arranged in parallel so that a parallel width of said input data is set to a predetermined value, and said input data includes an integral multiple data block, which is made up of bits included in words other than a final word located at a tail end of said input data, and a final word valid data block, which is made up of bits in said final word, and said integral multiple data block comprising a plurality of words that are successively divided by the generator polynomial, from a leading end of said input data with respect to every word which comprises bits represented by said predetermined value, said cyclic code processing circuit comprising:

an integral multiple data block remainder calculating unit that calculates an integral multiple data block remainder which is a remainder produced when said integral multiple data block is divided by said generator polynomial for every said word;

a final word valid data block remainder calculating unit that calculates a final word valid data block remainder which is a remainder produced when said final word valid data block made up of bits included in said final word of said input data is divided by said generator polynomial; and an input data remainder calculating unit that calculates said input data remainder based on the calculated integral multiple data block remainder and the calculated final word valid data block remainder, wherein said input data remainder calculating unit calculates said input data remainder by adding a product and said final word valid data block remainder, said product being obtained by multiplying, by said integral multiple data block remainder, a remainder computing coefficient which is a remainder produced by dividing, by said generator polynomial, a polynomial that only has terms of powers which have, as an exponent, the number of bits that make up said final word valid data block.

2. A cyclic code processing circuit according to claim 1, wherein said final word valid data block remainder calculating unit calculates, as said final word valid data block remainder, a remainder produced when data of the number of parallel bits are divided by said generator polynomial, by processing the bits represented by the number of parallel bits in parallel, said data of the number of parallel bits including the final word valid data block wherein the bit at the tail end of said final word valid data block is positioned at an end corresponding to the least significant bit, with all bits that are closer to the most significant bit than said final word valid data block being set to 0.

3. A cyclic code processing circuit according to claim 1, wherein said integral multiple data block remainder calculating unit and said final word valid data block remainder calculating unit comprise:

a control signal generating unit that outputs said input data per word which comprises the bits represented by the number of parallel bits, successively from the leading end, and, when outputting data making up said final word valid data block, outputting a final word valid data signal indicating that the data which are output make up said final word valid data block, and shifting information representing a number produced by subtracting the number of bits making up said final word valid data block from the number of parallel bits;

a shifting unit that receives the data output from said control signal generating unit, outputting data wherein the received data are shifted toward the least significant bit of the word by as many bits as the number represented by said shifting information, and all bits that are closer to the most significant bit of the word than the shifted data are set to 0 if said shifting information is output from said control signal generating unit, and outputting the received data if said shifting information is not output from said control signal generating unit;

a selecting unit that receives data output from a preceding processing process, outputting data made up of as many 0s as the order of said generator polynomial if said final word valid data signal is output from said control signal generating unit, and outputting the received data if said final word valid data signal is not output from said control signal generating unit; and a computing unit that processes the bits represented by the number of parallel bits in parallel based on the data output from said shifting unit and the data output from said selecting unit, and outputting data representing the processed bits.

4. A cyclic code processing circuit according to claim 1, further comprising an error detection circuit that detects an error by adding, as a frame check sequence (FCS) value, said input data remainder calculated by said input data remainder calculating unit.

5. A cyclic code processing circuit according to claim 1, further comprising an error detection circuit that detects, based on said input data remainder calculated by said input data remainder calculating unit, an error in said input data.

6. A cyclic code processing circuit according to claim 1, further comprising an error detection circuit in which said input data remainder calculated by said input data remainder calculating unit is used to perform an error detecting process on said input data according to a cyclic redundancy check.

7. A network interface card which calculates an input data remainder which is a remainder produced when input data are divided by a generator polynomial, said input data comprising a plurality of successive bits arranged in parallel so that a parallel width of said input data is set to a predetermined value, and said input data includes an integral multiple data block, which is made up of bits included in words other than a final word located at a tail end of said input data, and a final word valid data block, which is made up of bits in said final word, and said integral multiple data block comprising a plurality of words that are successively divided by the generator polynomial, from a leading end of said input data with respect to every word which comprises bits represented said predetermined value, said network interface card comprising:

an integral multiple data block remainder calculating unit that calculates an integral multiple data block remainder which is a remainder produced when said integral multiple data block is divided by said generator polynomial for every said word;

a final word valid data block remainder calculating unit that calculates a final word valid data block remainder which is a remainder produced when said final word valid data block made up of bits included in said final word of said input data is divided by said generator polynomial; and an input data remainder calculating unit that calculates said input data remainder based on the calculated integral multiple data block remainder and the calculated final word valid data block remainder, wherein said input data remainder calculating unit calculates said input data remainder by adding a product and said final word valid data block remainder, said product being obtained by multiplying, by said integral multiple data block remainder a remainder computing coefficient which is a remainder produced by dividing, by said generator polynomial, a polynomial that only has terms of powers which have, as an exponent, the number of bits that make up said final word valid data block.

8. A network interface card according to claim 7, wherein said final word valid data block remainder calculating unit calculates, as said final word valid data block remainder, a remainder produced when data of the number of parallel bits are divided by said generator polynomial, by processing the bits represented by the number of parallel bits in parallel, said data of the number of parallel bits including the final word valid data block wherein the bit at the tail end of said final word valid data block is positioned at an end corresponding to the least significant bit, with all bits that are closer to the most significant bit than said final word valid data block being set to 0.

9. A cyclic code processing method of calculating an input data remainder which is a remainder produced when input data are divided by a generator polynomial, are divided by a generator polynomial,
   said input data comprising a plurality of successive bits arranged in parallel so that a parallel width of said input data is set to a predetermined value, and said input data includes an integral multiple data block, which is made up of bits included in words other than a final word located at a tail end of said input data, and a final word valid data block, which is made up of bits in said final word, and
   said integral multiple data block comprising a plurality of words that are successively divided by the generator polynomial, from a leading end of said input data with respect to every word which comprises bits represented by said predetermined value,
   said cyclic code processing method comprising: calculating an integral multiple data block remainder which is a remainder produced when said integral multiple data block is divided by said generator polynomial for every said word;
   calculating a final word valid data block remainder which is a remainder produced when said final word valid data block made up of bits included in said final word of said input data is divided by said generator polynomial; and
   calculating said input data remainder based on the calculated integral multiple data block remainder and the calculated final word valid data block remainder,
   wherein said input data remainder is calculated by adding a product and said final word valid data block remainder, said product being obtained by multiplying by said integral multiple data block remainder a remainder computing coefficient which is a remainder produced by dividing, by said generator polynomial, a polynomial that only has terms of powers which have, as an exponent, the number of bits that make up said final word valid data block.

10. A cyclic code processing method according to claim 9, further comprising: calculating a remainder produced when data of the number of parallel bits are divided by said generator polynomial as said final word valid data block remainder, by processing the bits represented by the number of parallel bits in parallel, said data of the number of parallel bits including the final word valid data block wherein the bit at the tail end of said final word valid data block is positioned at an end corresponding to the least significant bit, with all bits that are closer to the most significant bit than said final word valid data block being set to 0.

* * * * *

UNITED STATES PATENT AND TRADEMARK OFFICE
CERTIFICATE OF CORRECTION

PATENT NO.       : 8,402,353 B2
APPLICATION NO.  : 12/557269
DATED            : March 19, 2013
INVENTOR(S)      : Masahiro Shigihara and Toru Takamichi It is certified that error appears in the above-identified patent and that said Letters Patent is hereby corrected as shown below:

In the Specification

Column 1, Line 54: Delete "(IFG;" and insert -- (IFG: --

Column 12, Line 63 (Approx.): Delete "$A(x)19\ x^{H(k)}$" and insert -- $A(x) \cdot x^{H(k)}$ --

Column 15, Line 20: Delete "Rb(x)," and insert -- Rb(x). --

Column 20, Line 67: Delete "(7)," and insert -- (7). --

Column 22, Line 22: Delete "$(ra_2-x^2$" and insert -- $(ra_2 \cdot x^2$ --

Column 22, Line 40: Delete "$ra_2 \sim bt_1$" and insert -- $ra_2 \cdot bt_1$ --

Column 24, Line 18: Delete "8B/100B" and insert -- 8B/10B --

Column 27, Line 53: Delete ""/TP/"" and insert -- "/T/" --

Column 29, Line 34 (Approx.): Delete "Ra(x)#(w-1)" and insert -- Ra(x)#(w-2) --

Column 31, Line 63: Delete "b multiplying" and insert -- multiplying --

Column 32, Line 7: Delete "ith" and insert -- with --

Signed and Sealed this
Twenty-first Day of October, 2014

Michelle K. Lee
*Deputy Director of the United States Patent and Trademark Office*